(12) United States Patent
Zhang et al.

(10) Patent No.: US 12,225,694 B2
(45) Date of Patent: Feb. 11, 2025

(54) SURFACE-MOUNTED HEAT SINK AND POWER MODULE USING SAME

(71) Applicant: Delta Electronics (Shanghai) Co., Ltd., Shanghai (CN)

(72) Inventors: Mingjuan Zhang, Shanghai (CN); Jun Yang, Shanghai (CN); Kai Dong, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 177 days.

(21) Appl. No.: 17/900,525

(22) Filed: Aug. 31, 2022

(65) Prior Publication Data

US 2023/0083132 A1 Mar. 16, 2023

(30) Foreign Application Priority Data

Sep. 16, 2021 (CN) .......................... 202122252219.9

(51) Int. Cl.
*H05K 7/20* (2006.01)
*H05K 1/02* (2006.01)
*H05K 1/18* (2006.01)
*H05K 3/30* (2006.01)

(52) U.S. Cl.
CPC .......... *H05K 7/209* (2013.01); *H05K 1/0203* (2013.01); *H05K 1/181* (2013.01); *H05K 3/303* (2013.01)

(58) Field of Classification Search
CPC ........ H05K 7/209; H05K 7/20; H05K 1/0203; H05K 1/181; H05K 3/303; H05K 7/20409; H05K 2201/066

See application file for complete search history.

(56) References Cited

U.S. PATENT DOCUMENTS

| | | | | |
|---|---|---|---|---|
| 9,980,396 | B1* | 5/2018 | Folker | H01F 27/006 |
| 2005/0012585 | A1* | 1/2005 | Moncada | H01F 27/306 |
| | | | | 336/184 |
| 2010/0128443 | A1* | 5/2010 | Chen | H01L 23/4093 |
| | | | | 165/185 |
| 2019/0122806 | A1* | 4/2019 | Chou | H05K 1/141 |
| 2020/0352056 | A1* | 11/2020 | Yoshida | H05K 7/20409 |
| 2021/0136948 | A1* | 5/2021 | Tanaka | H05K 1/0203 |

FOREIGN PATENT DOCUMENTS

| | | |
|---|---|---|
| CN | 201655782 U | 11/2010 |
| CN | 206743104 U | 12/2017 |
| CN | 209517620 U | 10/2019 |

* cited by examiner

*Primary Examiner* — Adam B Dravininkas
(74) *Attorney, Agent, or Firm* — KIRTON McCONKIE; Evan R. Witt

(57) ABSTRACT

The present disclosure relates to a surface-mounted heat sink and a power module using the same. The power module includes a circuit board, a magnetic element and at least one power device. The magnetic element is disposed at an upper side of the circuit board, the at least one power device is disposed on a surface of the circuit board and located between the magnetic element and a lower side of the circuit board. The surface-mounted heat sink is disposed on the surface of the circuit board and adjacent to the at least one power device. A top surface disposed on one side of the magnetic element and the surface of the circuit board form a limiting height, the surface-mounted heat sink has a first height formed between a sucked surface and a surface-mounted surface thereof, and the limiting height is greater than or equal to the first height.

20 Claims, 20 Drawing Sheets

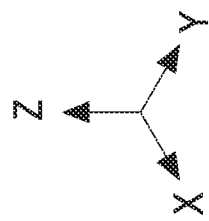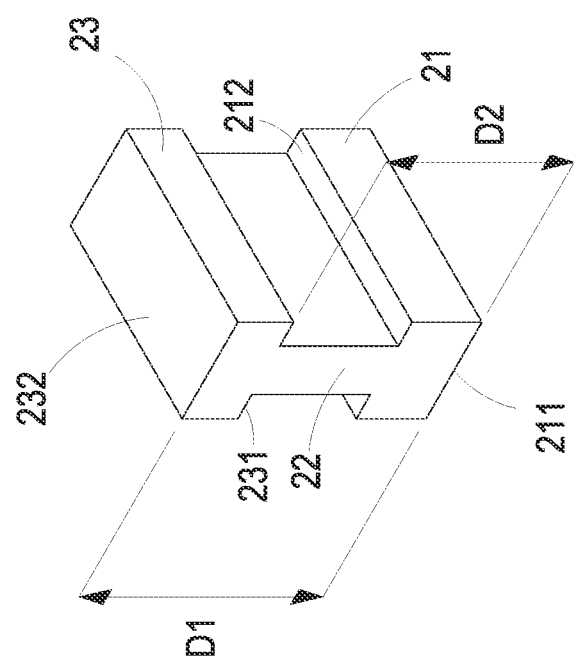
FIG. 5

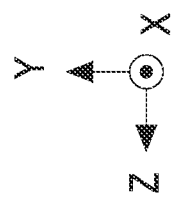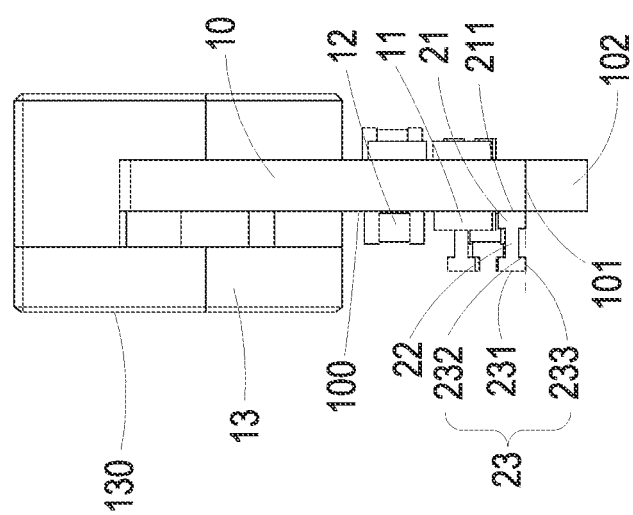
FIG. 6

SURFACE-MOUNTED HEAT SINK AND POWER MODULE USING SAME

CROSS-REFERENCE TO RELATED APPLICATION

This application claims priority to China Patent Application No. 202122252219.9, filed on Sep. 16, 2021. The entire contents of the above-mentioned patent applications are incorporated herein by reference for all purposes.

FIELD OF THE INVENTION

The present disclosure relates to a technology field of power electronic devices, and more particularly to a surface-mounted heat sink and a power module using the same for improving the heat dissipation efficiency in a switching power module with small space and high heat dissipation requirements, simplifying the assembling and manufacturing process and reducing the cost.

BACKGROUND OF THE INVENTION

As an important part of power conversion, modern power electronic devices are widely used in the industries of electric power, electronics, electric motors and energy sources. With the development of power electronics technology, higher requirements are put forward for the power level, the power density and the modularity of the high-power switching power supply. Furthermore, it needs to consider the requirements of high power density and heat dissipation efficiency for the modular layout of high-power switching power supply.

The conventional power modules often use surface mounted devices (SMD) and planar magnetic technology to achieve fully automated assembly of modules and improve the production efficiency of the power module greatly. Moreover, the use of the planar magnetic technology can achieve consistent control of parasitic parameters, ensuring the consistency of the electrical parameters of mass-produced modules. In this type of power module, most of the space on the circuit board is occupied by the arrangement of planar magnetic components. For considering the heat dissipation requirements of the planar magnetic components, the planar magnetic components are generally arranged on the top side of the circuit board, and the power module is inserted into the system motherboard through the socket on the lower side of the circuit board. However, in such arrangement, the available space for other components is reduced relatively. For example, the components such as power switches or ceramic capacitors have to be confined between the planar magnetic component and the lower side of the circuit board. Due to the demand for high power density, the power switches need to be concentrated and disposed, and it also brings challenges to the heat dissipation of the power switches. Especially, for the region concentrated with the heat-generating components, the heat dissipation requirements are high. If the conventional heat sink in one piece is used for heat dissipation, the installation procedure is complicated and the automated production cannot be realized. Furthermore, sufficient internal space is required for installation. It is not conducive to improving the entire density of the power module. In addition, for the region with the heat-generating components dispersed relatively, if a surface-mounted copper block is used for heat dissipation, the surface-mounted copper block is generally cuboid due to manufacturing process and cost constraints, so the heat dissipation efficiency is limited and the cost is higher. On the other hand, the ceramic capacitor is usually disposed adjacent to the lower side of the circuit board. When the power module is inserted into the system motherboard, the ceramic capacitor is broken easily due to the blind insertion operation.

Therefore, there is a need to provide a surface-mounted heat sink and a power module using the same for improving the heat dissipation efficiency in a switching power module with small space and high heat dissipation requirements, simplifying the assembling and manufacturing process and reducing the cost, so as to address the above issues encountered by the prior arts.

SUMMARY OF THE INVENTION

An object of the present disclosure provides a surface-mounted heat sink and a power module using the same. The surface-mounted heat sink has a small size and is formed into one piece by aluminum alloy material. It is suitable for heat dissipation of a switching power module with high-power density. With the surface tin-plated, the surface-mounted heat sink is soldered on the circuit board directly or mounted together with the other surface-mounted power devices by the surface mount technology. It is easy to realize automation, and improve the production efficiency. The accuracy of placement is high. It prevents from short-circuiting or cracking due to touching peripheral devices when manually installing the heat sink. In addition, the cost of the surface-mounted heat sink made of aluminum alloy material is lower than that of the surface-mounted copper block.

Another object of the present disclosure provides a surface-mounted heat sink and a power module using the same. The fin portion above the surface-mounted portion is connected thereto through the support portion. When the surface-mounted heat sink and the power device are installed on the surface of the circuit board, the height difference between the fin portion and the surface-mounted portion is formed, and the width of the fin portion is extendable. Furthermore, the fin portion, the support portion and the surface-mounted portion form a symmetrical or asymmetrical T-shaped or H-shaped cross-section. A larger heat dissipation area is provided so as to improve the heat dissipation efficiency. Since the assembling and manufacturing process of the surface-mounted heat sink is simple, the space above the power device is utilized effectively, the size of the surface-mounted heat sink is small, and the application of the surface-mounted heat sink is flexible, it meets the heat dissipation requirements when the surface-mounted heat sink applied in a smaller space. Moreover, by combining and utilizing the surface-mounted heat sinks with different cross-section types, the heat dissipation problems in confined spaces are solved effectively. On the other hand, the top surface of the fin portion is extended, and it facilitates suction through the suction nozzle. Whereby, when the surface-mounted surface is soldered to the periphery of the power device on the circuit board through the reflow soldering process, it is easy to realize automation and further simplify the assembling process of heat dissipation devices. The cost of the power module is reduced, and the product competitiveness is enhanced.

A further object of the present disclosure provides a surface-mounted heat sink and a power module using the same. When the surface-mounted heat sink is disposed on the circuit board of the power module through the surface-mounted surface of the surface-mounted portion, the fin portion of the surface-mounted heat sink has a lateral side or an extension side coplanar with the lower side of the circuit board. Thus, when the power module is inserted into the system motherboard through a plug-in portion on the lower side of the circuit board, and soldered together with the system motherboard, the fin portion of the surface-mounted heat sink provides a positioning function. It avoids causing the ceramic capacitor broken due to manual blind insertion during the process of soldering the power module on the system motherboard.

In accordance with an aspect of the present disclosure, a surface-mounted heat sink is provided and applied to a power module structure. The power module includes a circuit board, a magnetic element and at least one power device. The magnetic element is disposed at an upper side of the circuit board. The at least one power device is disposed on a surface of the circuit board and located between the magnetic element and a lower side of the circuit board. The surface-mounted heat sink is disposed on the surface of the circuit board and adjacent to the at least one power device. A top surface disposed on one side of the magnetic element and the surface of the circuit board form a limiting height, the surface-mounted heat sink has a first height formed between a sucked surface and a surface-mounted surface thereof, and the limiting height is greater than or equal to the first height.

In an embodiment, the surface-mounted heat sink includes a surface-mounted portion, a support portion and a fin portion. The surface-mounted portion includes the surface-mounted surface attached to the surface of the circuit board. The support portion is extended from the surface-mounted surface and away therefrom. The fin portion is spatially corresponding to the surface-mounted surface of the surface-mounted portion. The fin portion includes a bottom surface and the sucked surface parallel to each other, and the bottom surface is connected to the support portion. The fin portion is extended in a space collaboratively defined by the magnetic element and the lower side of the circuit board.

In accordance with an aspect of the present disclosure, a power module is provided. The power module includes a circuit board, a magnetic element, at least one power device and at least one surface-mounted heat sink. The circuit board includes a surface, an upper side and a lower side, wherein the upper side and the lower side are two opposite sides, and the surface is connected between the upper side and the lower side. The magnetic element is disposed adjacent to the upper side of the circuit board, and partially covers the surface of the circuit board. The at least one power device is disposed on the surface of the circuit board, and located between the magnetic element and the lower side of the circuit board. The at least one surface-mounted heat sink is disposed on the surface of the circuit board and adjacent to the at least one power device, wherein a top surface disposed on one side of the magnetic element and the surface of the circuit board form a limiting height, the surface-mounted heat sink has a first height formed between a sucked surface and a surface-mounted surface thereof, and the limiting height is greater than or equal to the first height.

BRIEF DESCRIPTION OF THE DRAWINGS

FIG. 5 is a perspective view illustrating the surface-mounted heat sink of the power module according to the first embodiment of the present disclosure;

FIG. 6 is a lateral view illustrating the power module according to a second embodiment of the present disclosure;

DETAILED DESCRIPTION OF THE PREFERRED EMBODIMENT

Figure 1:
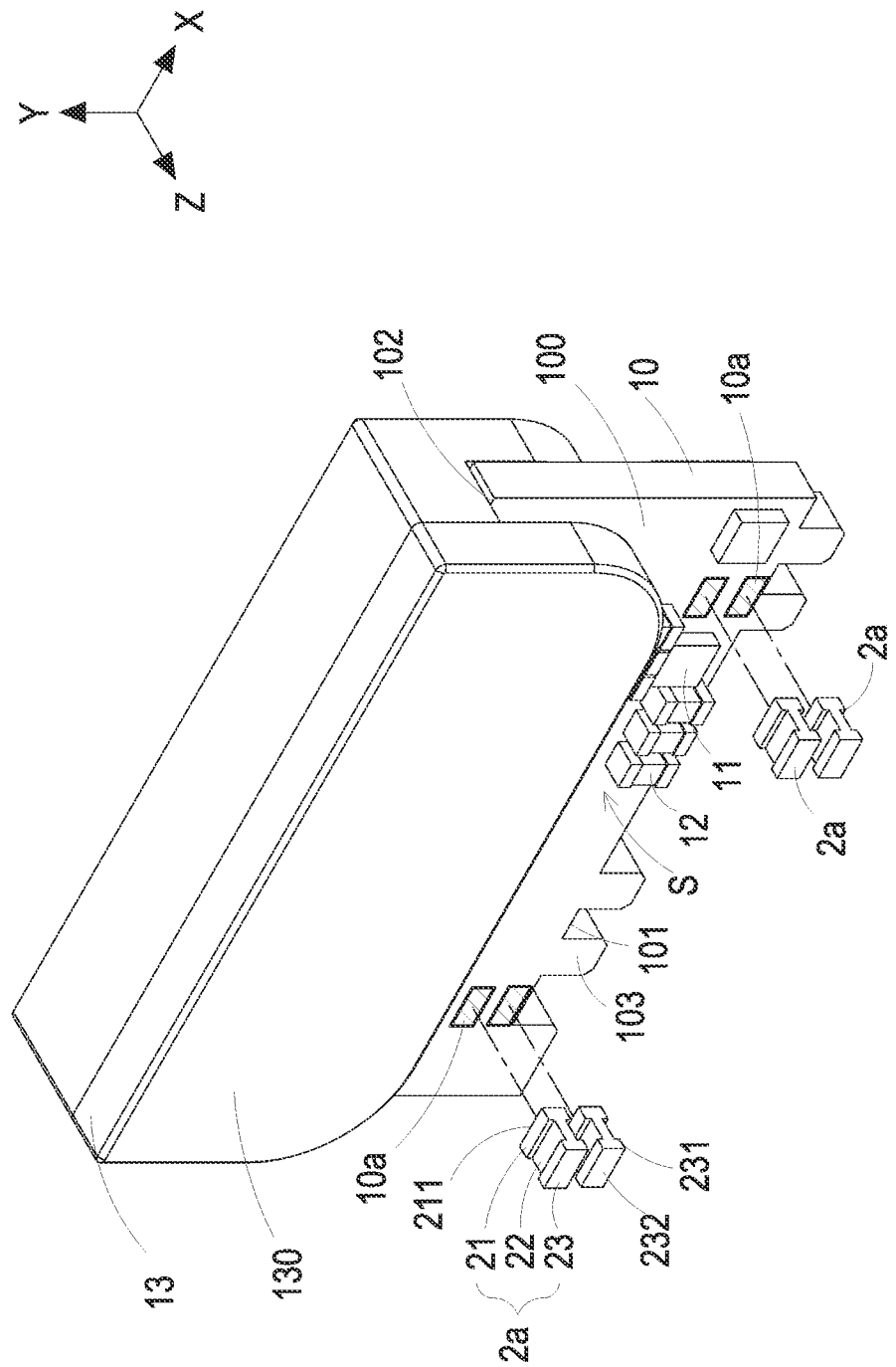
FIG. 1 is an exploded view illustrating a power module according to a first embodiment of the present disclosure.
Figure 2:
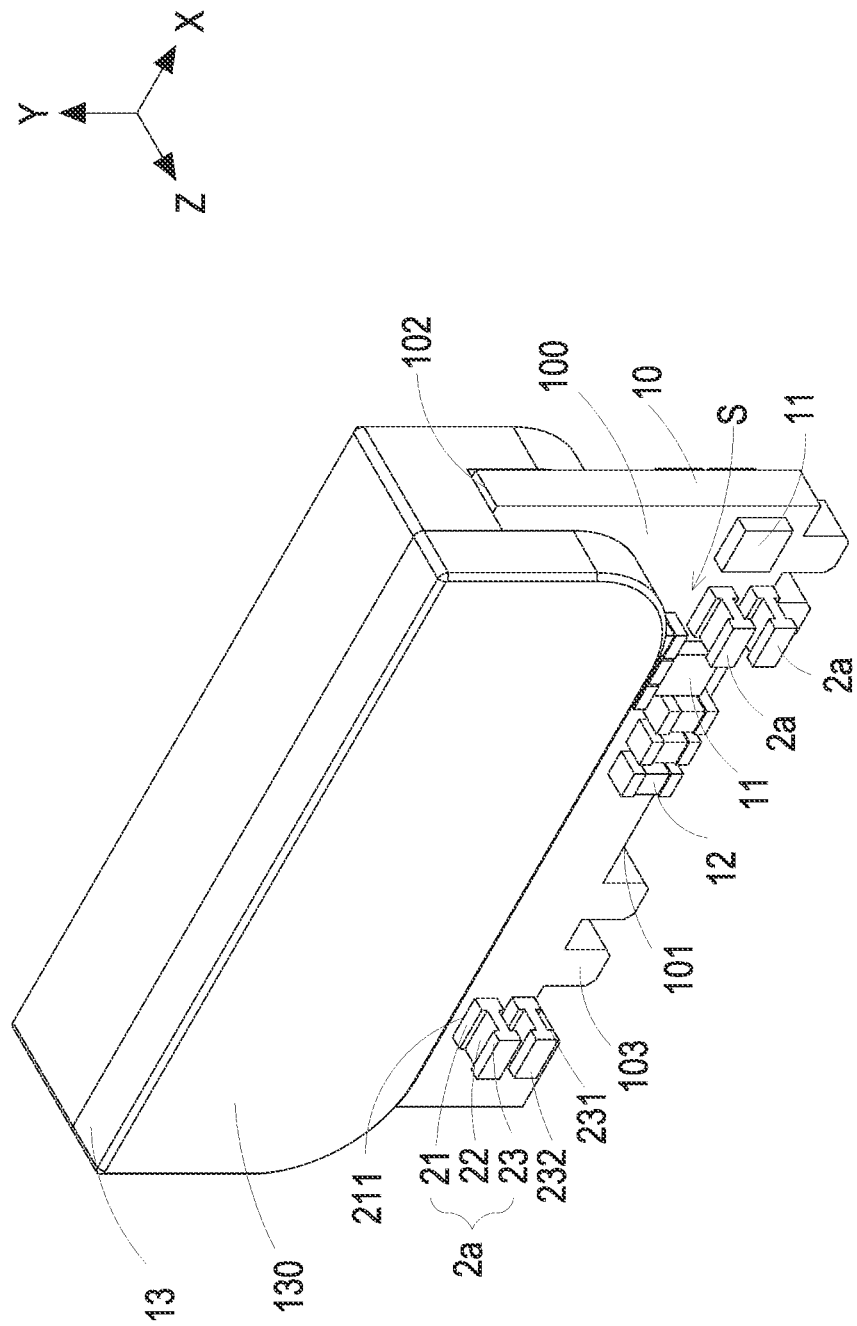
FIG. 2 is a perspective view illustrating the power module according to the first embodiment of the present disclosure.
Figure 3:
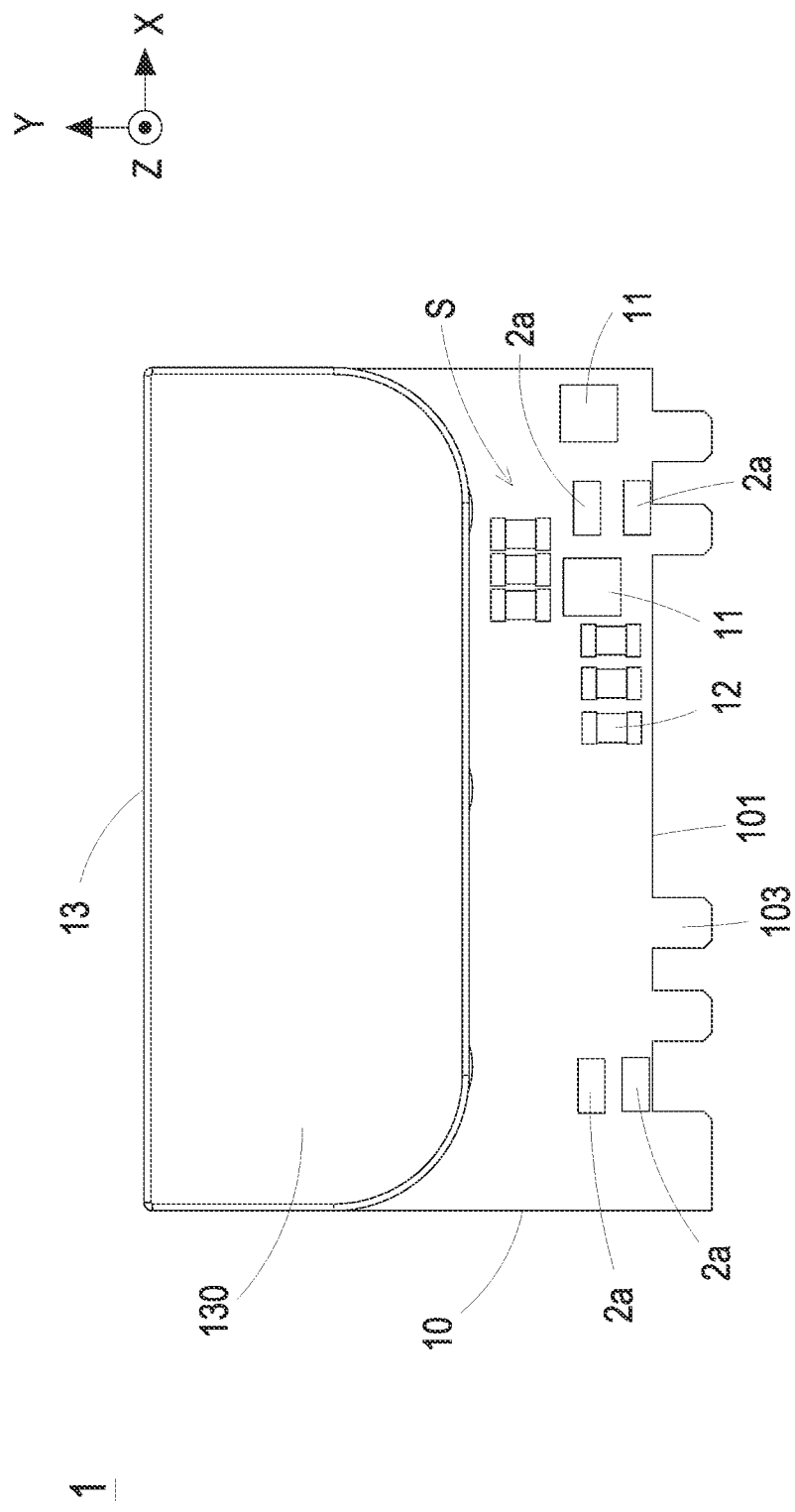
FIG. 3 is a front view illustrating the power module according to the first embodiment of the present disclosure.
Figure 4:
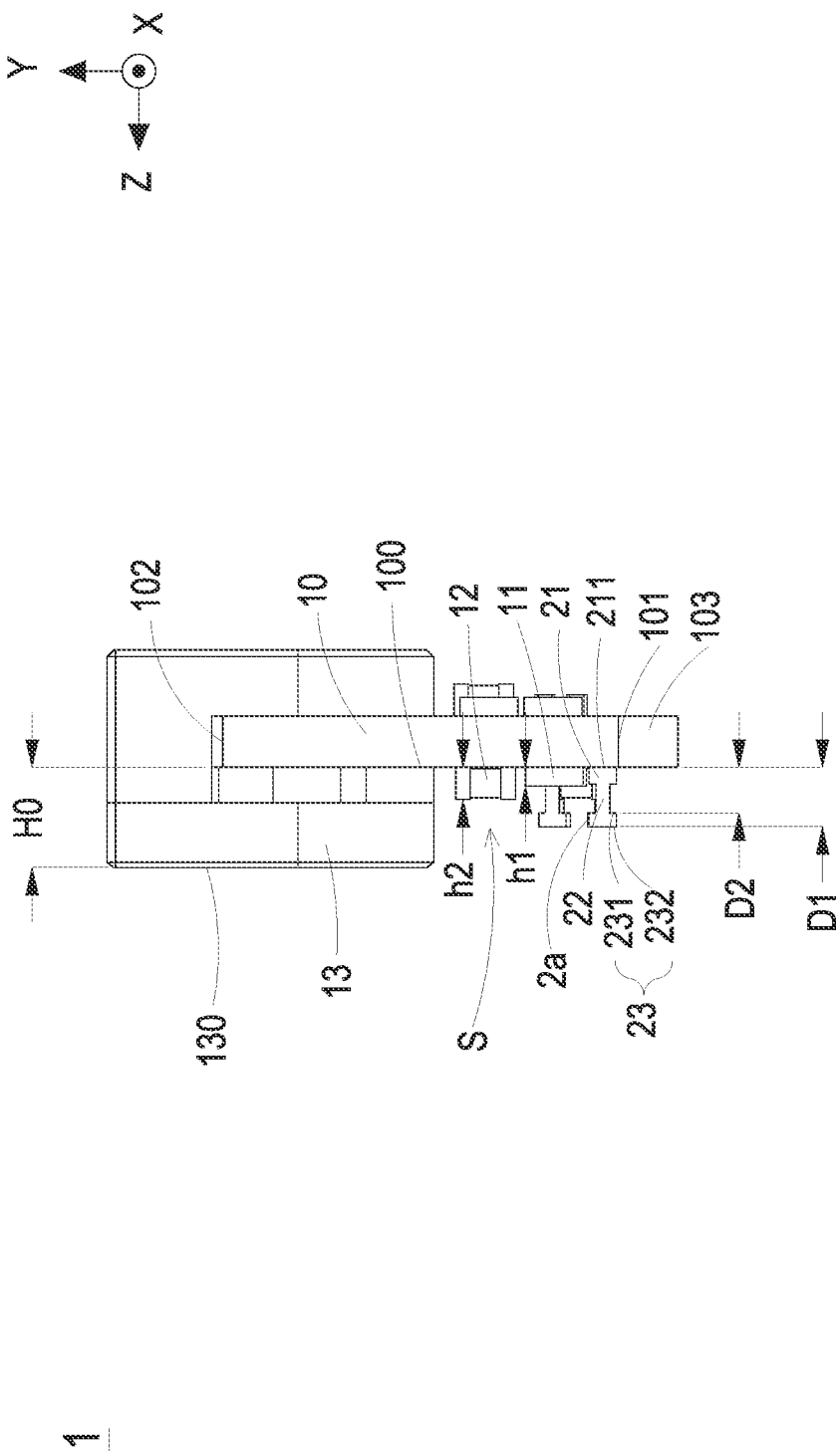
FIG. 4 is a lateral view illustrating the power module according to the first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

FIGS. 1 to 4 show a power module according to a first embodiment of the present disclosure. FIG. 5 is a perspective view illustrating the surface-mounted heat sink of the power module according to the first embodiment of the present disclosure. In the embodiment, the power module 1 includes a circuit board 10, a magnetic element 13, at least one power device and at least one surface-mounted heat sink 2a. Preferably but not exclusively, the magnetic element 13 is a transformer or an inductor. The magnetic element 13 include a magnetic core and winding, the magnetic column of the magnetic core is passed through a hole of the circuit board 10, and the winding is wound on the corresponding magnetic column. Preferably but not exclusively, the winding is integrally formed with the circuit board 10 into one piece, or individually wound. The circuit board 10 includes a surface 100, an upper side 102 and a lower side 101. The upper side 102 and the lower side 101 are two opposite sides. The surface 100 is connected between the upper side 102 and the lower side 101. The magnetic element 13 is disposed adjacent to the upper side 101 of the circuit board 10 and covers a part of the surface 100. In the embodiment, a space S is collaboratively defined by the magnetic element 13 and the lower side 101 of the circuit board 10. Preferably but not exclusively, the at least one power device includes a surface-mounted switching device 11 and a ceramic capacitor 12, which are disposed on the surface 100 of the circuit board 10 and located between the magnetic element 13 and the lower side 101 of the circuit board 10. At least one surface-mounted heat sink 2a is disposed on the surface 100 of the circuit board 10. Preferably but not exclusively, the at least one surface-mounted heat sink 2a is spatially corresponding to and disposed adjacent to the surface-mounted switching device 11. A top surface 130 disposed on one side of the magnetic element 13 and the surface 100 of the circuit board 10 form a limiting height H0, the surface-mounted heat sink 2a has a first height D1 formed between a sucked surface 232 and a surface-mounted surface 211 thereof, and the limiting height H0 is greater than or equal to the first height D1. The height of the power module 1 is limited by the limit height H0, and the surface-mounted heat sink 2a does not occupy more internal space of the power module 1. Moreover, since the first height D1 of the surface-mounted heat sink 2a is smaller than the limit height H0 of the power module 1, it is helpful of guiding the wind flow toward the region where the lower portion of the magnetic element 13 and the surface-mounted heat sink 2a are located. Thus, the heat dissipation of the surface-mounted switching device 11 is improved.

In the embodiment, the surface-mounted heat sink 2a includes a surface-mounted portion 21, a support portion 22 and a fin portion 23. The surface-mounted portion 21 includes the surface-mounted surface 211 attached to the surface 100 of the circuit board 10. The support portion 22 is extended from the surface-mounted portion 21 and away from surface-mounted surface 211. The fin portion 23 is spatially corresponding to the surface-mounted surface 211 of the surface-mounted portion 21. In the embodiment, the fin portion 23 includes a bottom surface 231 and a sucked surface 232 parallel to each other. Preferably but not exclusively, the support portion 22 is rectangular and perpendicular to the bottom surface 231 and the surface-mounted surface 211, so that the surface area of the surface-mounted heat sink 2a is increased, and it is helpful of enhancing the heat dissipation capacity. In an embodiment, a part of the bottom surface 231 and the sucked surface 232 of the fin portion 23, and the surface-mounted surface 211 of the surface-mounted portion 21 are parallel to each other. In another embodiment, the fin portion 23 is bent or extended arbitrarily in the space S according to the practical requirements. That is, the pin portion 23 is not parallel to the surface-mounted surface 211 of the surface-mounted portion 21. The extending direction, the length and the bending magnitude of the pin portion 23 are adjustable in the space S, and the present disclosure is not limited thereto. Notably, the surface-mounted portion 21, the support portion 22 and the fin portion 23 of the surface-mounted heat sink 2a are integrated molding by an aluminum alloy material, which is easier to shape than the copper in producing process. Preferably but not exclusively, the fin portion 23 and the surface-mounted portion 21 are parallel to each other and perpendicular to the support portion 22. The producing process is simpler. With the surface tin-plated on the surface-mounted portion 21, the surface-mounted heat sink 2a is soldered on the soldering pad 10a of the circuit board 10 directly or mounted together with the other surface-mounted switching device 11 and a ceramic capacitor 12 by the surface mount technology. It is easy to realize automation, and improve the production efficiency. The accuracy of placement is high. It prevents the power module 1 from short-circuiting or cracking due to touching peripheral devices when manually installing the heat sink. In addition, the cost of the surface-mounted heat sink 2a made of aluminum alloy material is lower than that of the surface-mounted copper block.

Preferably but not exclusively, in the embodiment, the surface-mounted surface 211 of the surface-mounted heat sink 2a is attached to the soldering pad 10a on the surface 100 of the circuit board 10 through a reflow soldering process. In the embodiment, the fin portion 23, the support portion 22 and the surface-mounted portion 21 integrally form an H-shaped cross-section. In an embodiment, a projection area of the fin portion 23 on the surface 100 of the circuit board 10 is greater than a projection area of the support portion 22 on the surface 100 of the circuit board 10.

Preferably but not exclusively, in the embodiment, the projection area of the fin portion 23 on the surface 100 of the circuit board 10 is equal to a projection area of the surface-mounted portion 21 on the surface 100 of the circuit board 10. In other words, since the above fin portion 23 and the surface-mounted portion 21 are connected through the support portion 22, when the surface-mounted heat sink 2a and the surface-mounted switching device 11 are arranged on the surface 100 of the circuit board 10, a height difference is formed. In that, the width of the fin portion 23 is extendable. Preferably but not exclusively, the fin portion 23, the support portion 22 and the surface-mounted portion 21 collaboratively form a symmetrical H-shaped cross section, so as to provide a larger heat dissipation area, thereby improving the heat dissipation efficiency.

Preferably but not exclusively, in other embodiments, the fin portion 23 is not parallel to the surface-mounted surface 211, and the maximum distance between the bottom surface 231 and the surface-mounted surface 211 is defined as a second height D2. Alternatively, the minimum distance between the bottom surface 231 and the surface-mounted surface 211 is defined as a second height D2. In this way, the space under the surface-mounted heat sink 2a is fully utilized to place electronic components and improve space utilization. Moreover, the space above the surface-mounted switching device 11 is effectively utilized by the surface-mounted heat sink 2a without affecting the power density of the power module 1, and the heat dissipation efficiency is improved.

In the embodiment, the shape of the fin portion 23 is adjustable according to the practical requirements. For performing the mounting procedure of the surface-mounted heat sink 2a, a suction nozzle is used to suck the sucked surface 232. In some embodiments, the sucked surface 232 and the surface-mounted surface 211 are parallel to each other. Preferably but not exclusively, in other embodiments, the fin portion 23 is not parallel to the surface-mounted surface 211 of the surface-mounted portion 21, but bent or extended arbitrarily in the space S. In that, an automatic grasping device still can be utilized to realize the installation of the surface-mounted heat sink 2a. In the embodiment, a second height D2 is formed between the bottom surface 231 and the surface-mounted surface 211 of the surface-mounted portion 21. Preferably but not exclusively, the second height D2 is greater than a device height h1, which is formed by disposing the at least one surface-mounted switching device 11 on the surface 100 of the circuit board 10. In other embodiments, the power module 1 includes a plurality of surface-mounted switching devices 11, and the plurality of surface-mounted switching devices 11 are disposed on the surface 100 of the circuit board 10 to form different device heights. The second height D2 is greater than one of the plurality of device heights. Preferably but not exclusive, the second height D2 is greater than the largest one of the plurality of device heights. In other embodiments, the fin portion 23 is not parallel to the surface-mounted surface 211. Preferably but no exclusively, the maximum distance between the bottom surface 231 and the surface-mounted surface 211 is defined as the second height D2. Preferably but not exclusively, the minimum distance between the bottom surface 231 and the surface-mounted surface 211 is defined as the second height D2. In some embodiments, the second height D2 is greater than a capacitor height h2, which is formed by disposing the ceramic capacitor 12 on the surface 100 of the circuit board 10. In this way, the space under the surface-mounted heat sink 2a is fully utilized to place electronic components and improve space utilization. Moreover, the space above the surface-mounted switching device 11 or the ceramic capacitor 12 is effectively utilized by the surface-mounted heat sink 2a without affecting the power density of the power module 1, and the heat dissipation efficiency is improved.

On the other hand, in the embodiment, the top surface 130 disposed on one side of the magnetic element 13 and the surface 100 of the circuit board 10 form the limiting height H0, the surface-mounted heat sink 2a has the first height D1 formed between the sucked surface 232 and the surface-mounted surface 211 thereof, and the limiting height H0 is greater than or equal to the first height D1. In other embodiments, the fin portion 23 is not parallel to the surface-mounted surface 211. Preferably but not exclusively, the maximum distance between the bottom surface 231 and the surface-mounted surface 211 is defined as the second height D2. Preferably but not exclusively, the minimum distance between the bottom surface 231 and the surface-mounted surface 211 is defined as the second height D2. Thus, the space above the surface-mounted switching device 11 or the ceramic capacitor 12 is effectively utilized by the surface-mounted heat sink 2a without affecting the power density of the power module 1, and the heat dissipation efficiency is improved.

Figure 7:
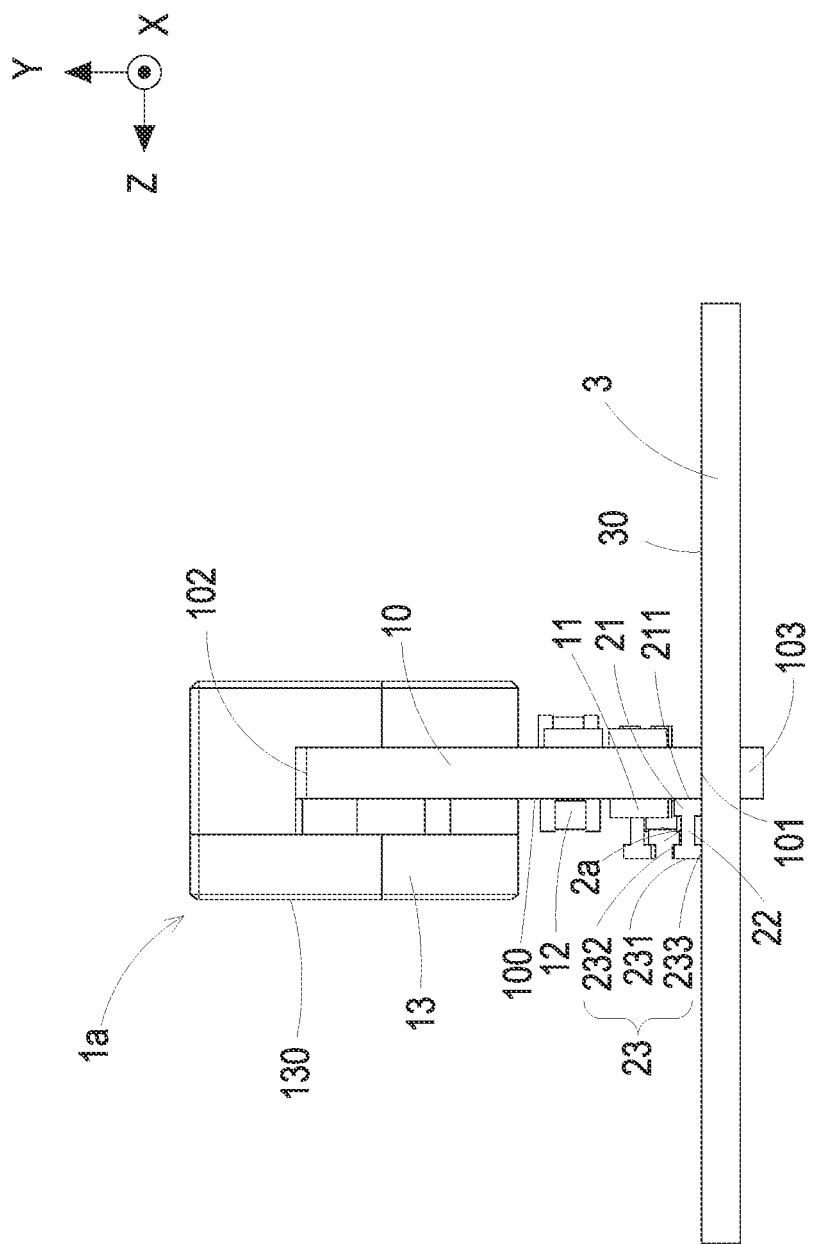
FIG. 7 is a lateral view illustrating the power module inserted into a system motherboard according to the second embodiment of the present disclosure.
Figure 8:
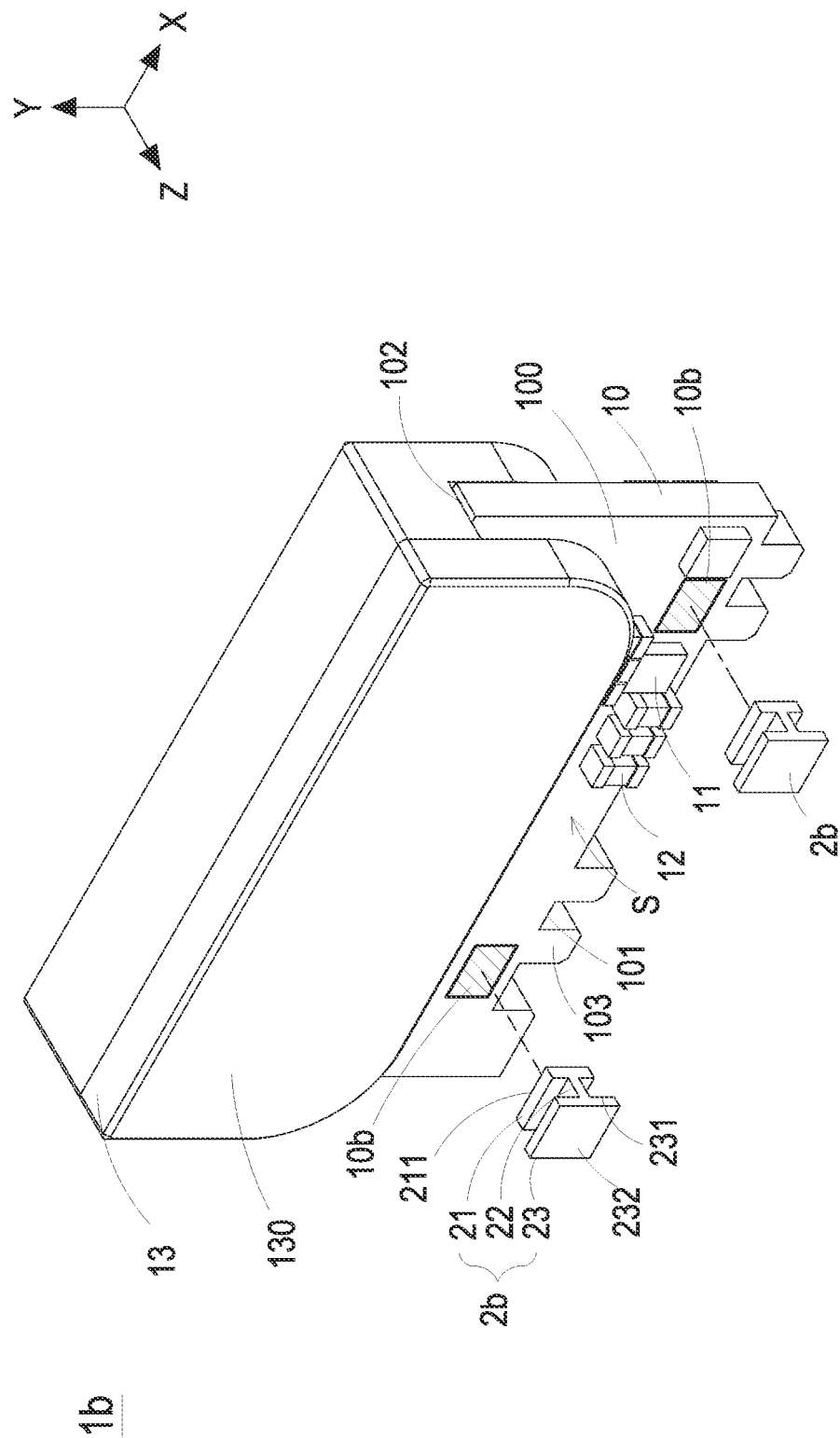
FIG. 8 is an exploded view illustrating a power module according to a third embodiment of the present disclosure.
Figure 9:
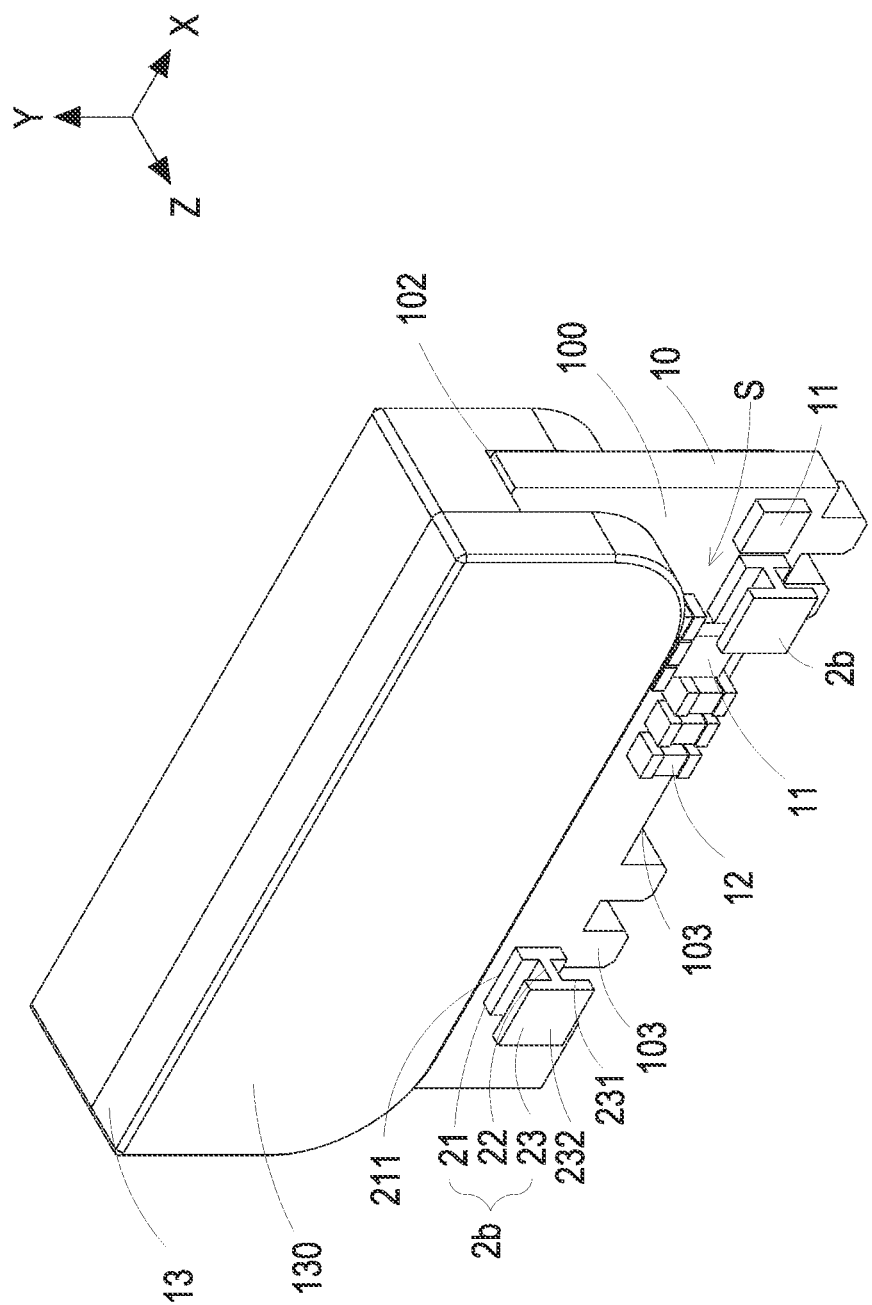
FIG. 9 is a perspective view illustrating the power module according to the third embodiment of the present disclosure.
Figure 10:
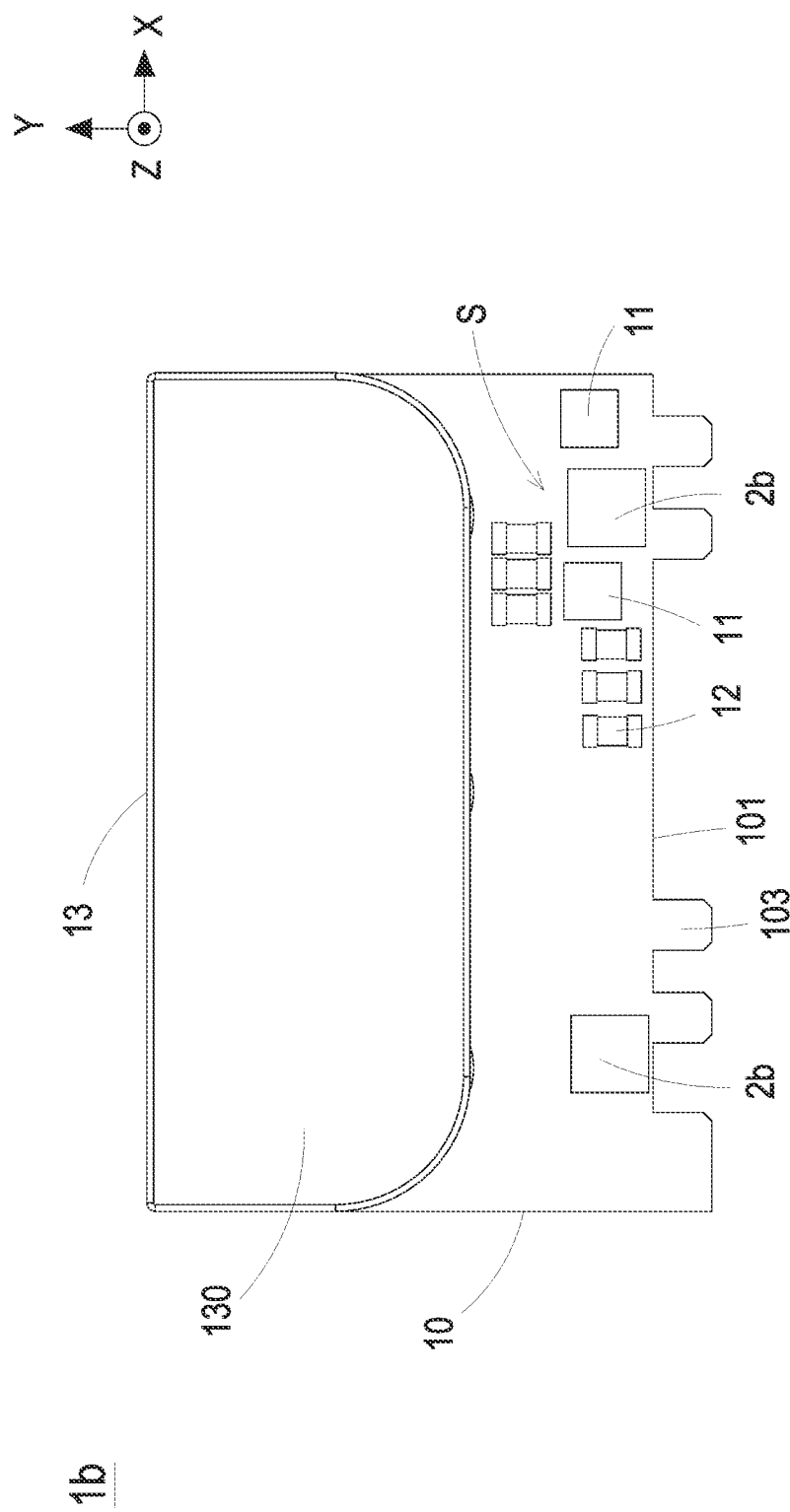
FIG. 10 is a front view illustrating the power module according to the third embodiment of the present disclosure.
Figure 11:
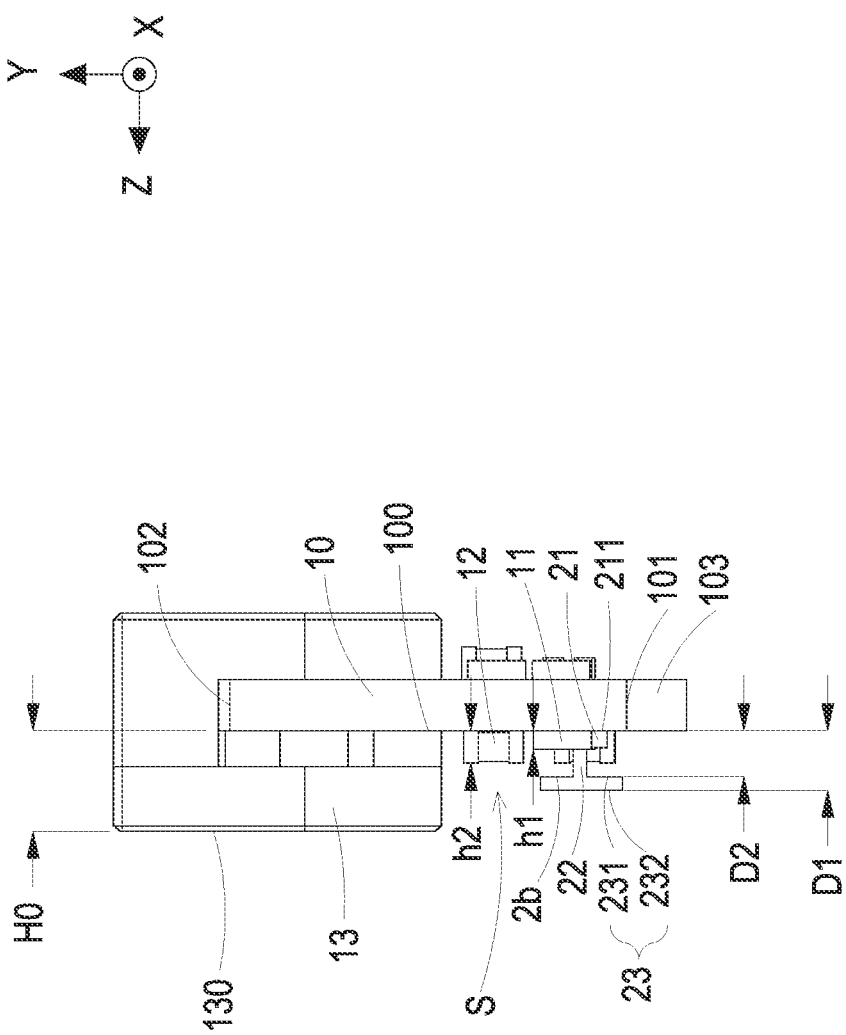
FIG. 11 is a lateral view illustrating the power module according to the third embodiment of the present disclosure.

FIG. 6 is a lateral view illustrating the power module according to a second embodiment of the present disclosure. FIG. 7 is a lateral view illustrating the power module inserted into a system motherboard according to the second embodiment of the present disclosure. In the embodiment, the power module 1a is similar to the power module 1 shown in FIGS. 1 to 4, and the same labels of the components represent the same components, structures and functions, not redundantly described herein. In the embodiment, the fin portion 23 of the surface-mounted heat sink 2a has an extension side 233 coplanar with the lower side 101 of the circuit board 10. The circuit board 10 further includes a plug-in portion 103, which is protruded outwardly from the lower side 101 and configured to insert the power module 1a into a system motherboard 3 therethrough. In the embodiment, when the power module 1a is inserted into the system motherboard 3 through the plug-in portion 103 of the circuit board 10, the extension side 233 of the fin portion 23 is attached to the surface 30 of the system motherboard 3. In other words, when the power module 1a is inserted into the system motherboard 3 through the plug-in portion 103 on the lower side 101 of the circuit board 10, the fin portion 23 of the surface-mounted heat sink 2a has the extension side 233 to provide a positioning function during soldering the power module 1a and the system motherboard 3 together. It prevents the power module 1a from causing the ceramic capacitor 12 broken due to manual blind insertion during the process of soldering the power module 1a on the system motherboard 3.

Figure 12:
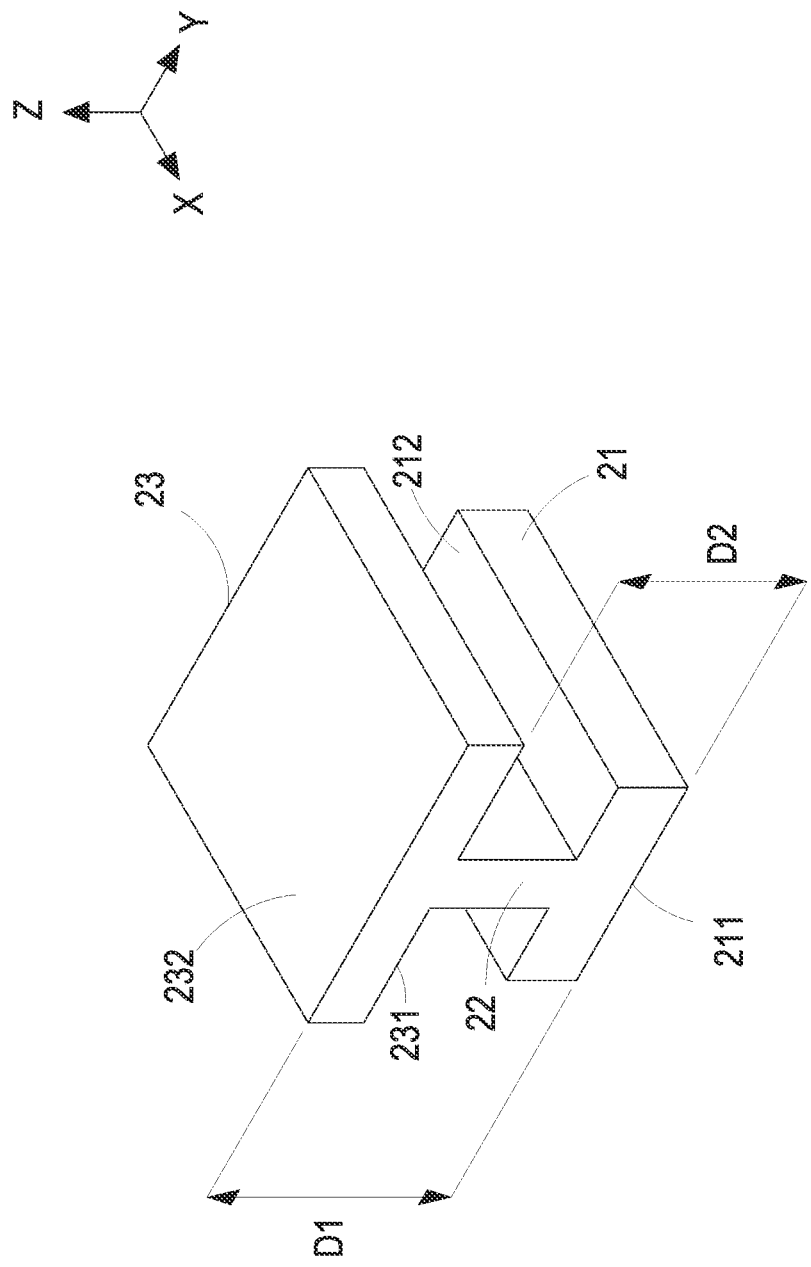
FIG. 12 is a perspective view illustrating the surface-mounted heat sink of the power module according to the third embodiment of the present disclosure.
Figure 13:
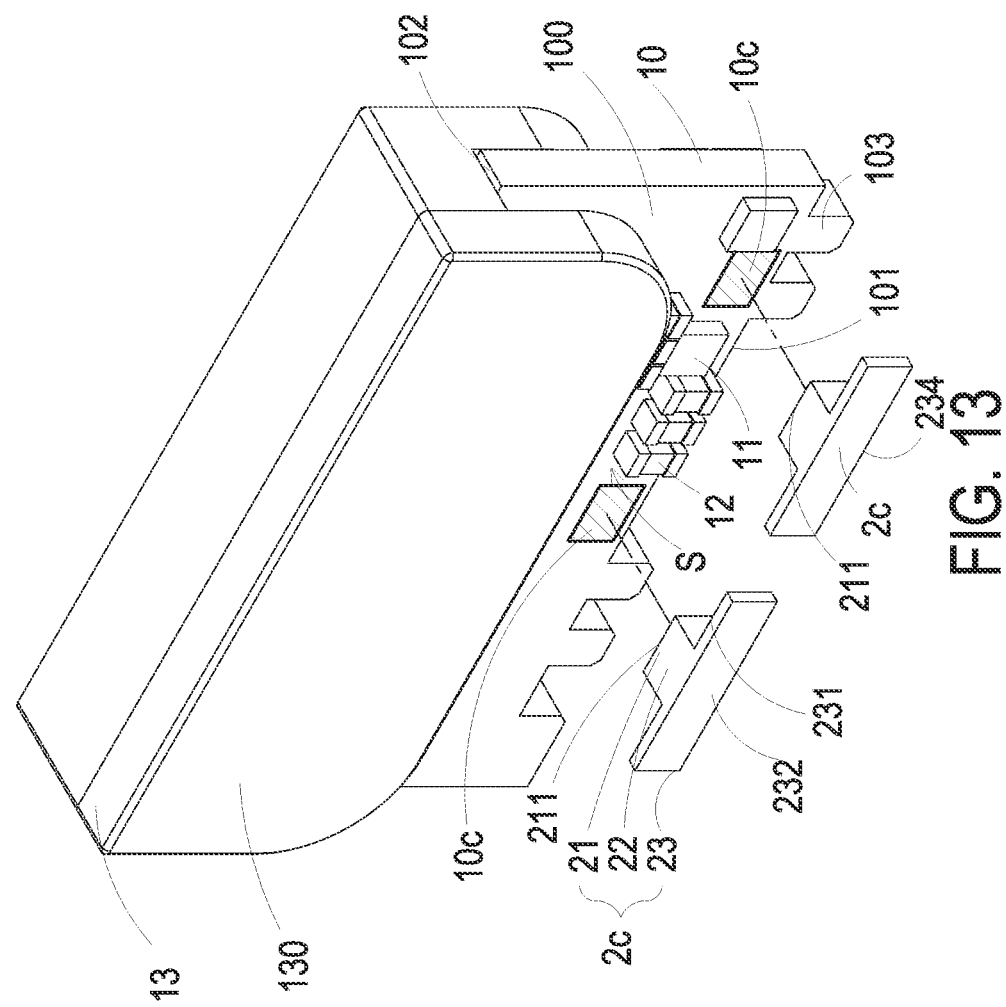
FIG. 13 is an exploded view illustrating a power module according to a fourth embodiment of the present disclosure.
Figure 14:
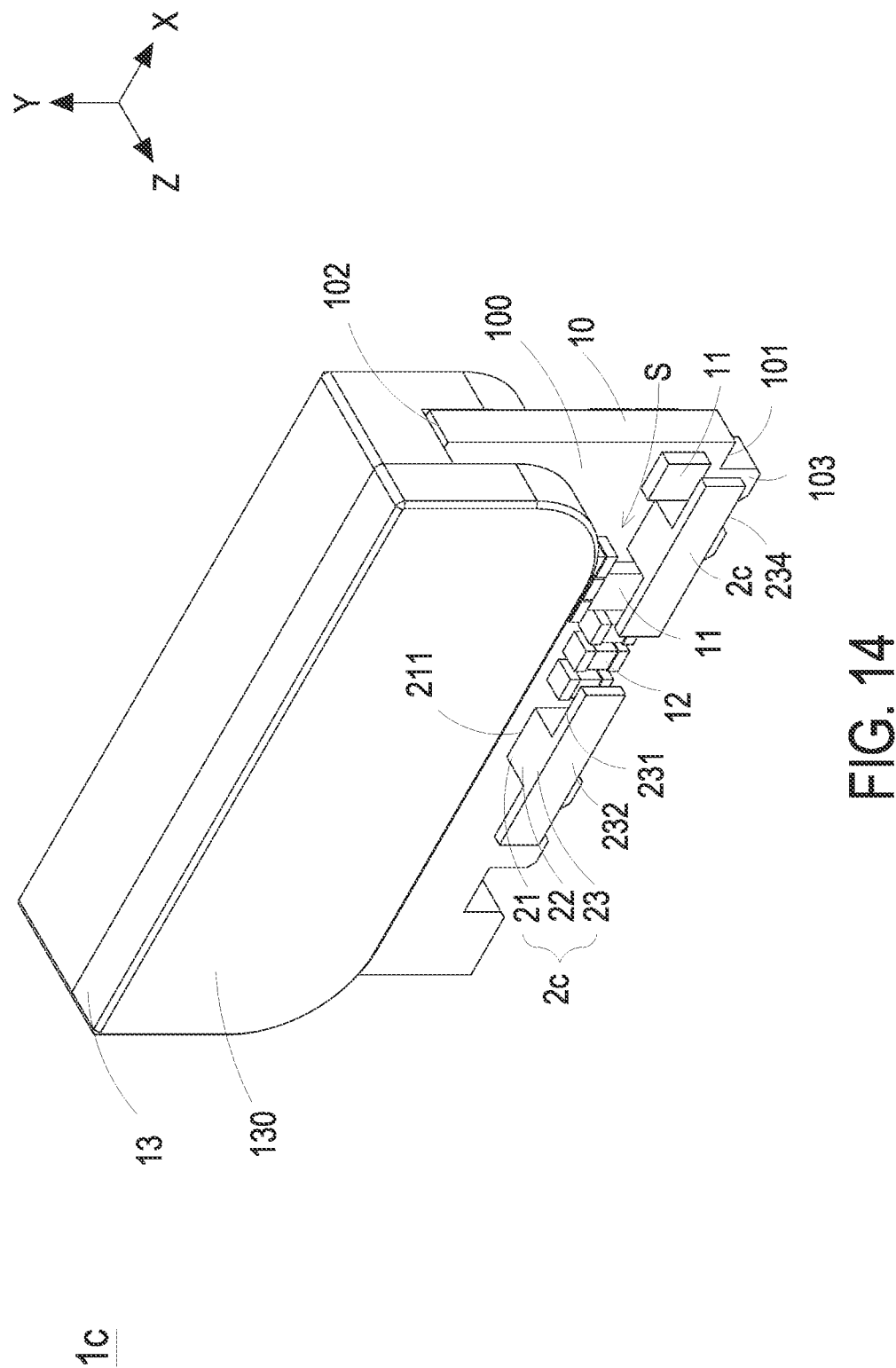
FIG. 14 is a perspective view illustrating the power module according to the fourth embodiment of the present disclosure.
Figure 15:
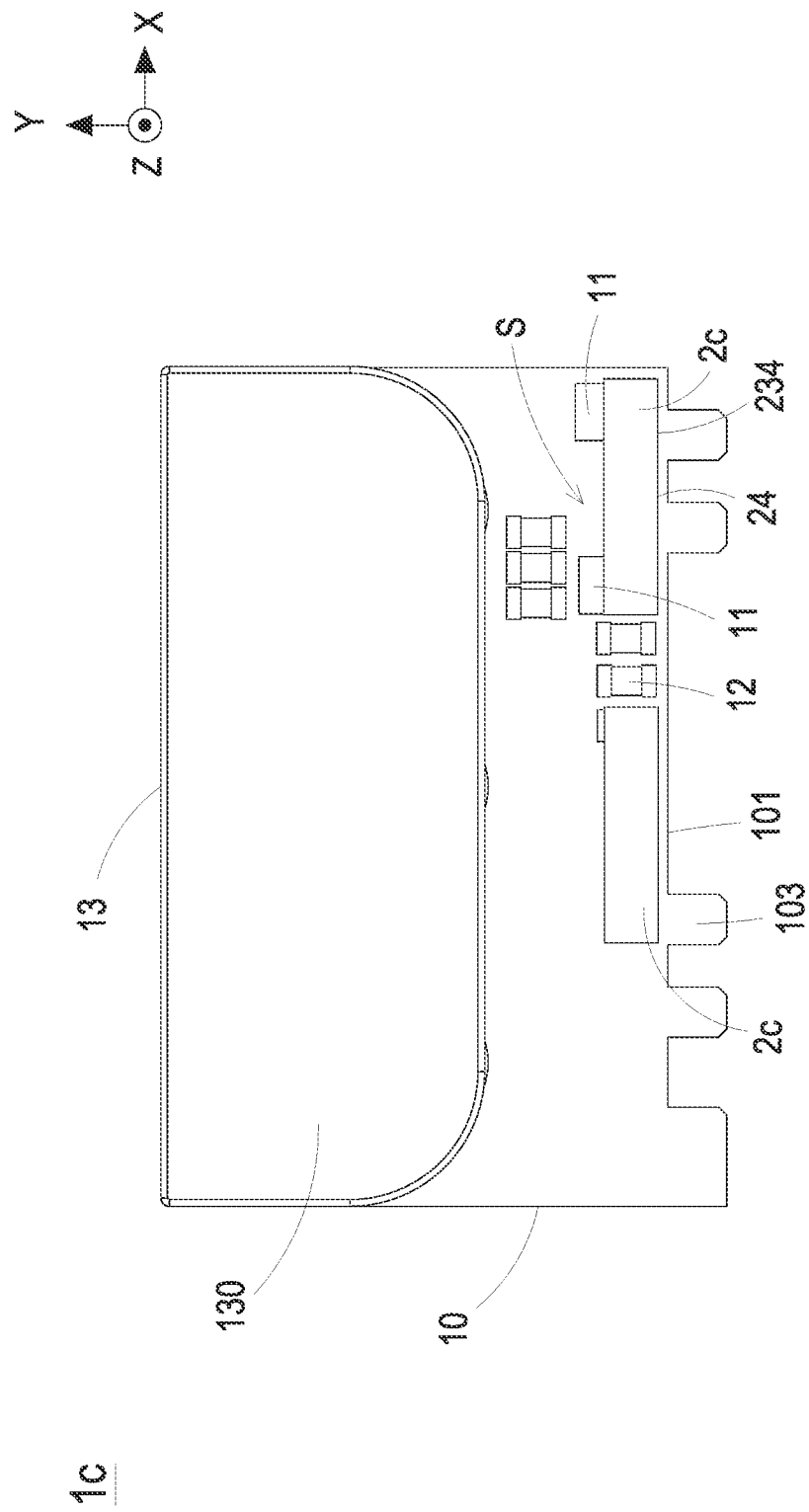
FIG. 15 is a front view illustrating the power module according to the fourth embodiment of the present disclosure.
Figure 16:
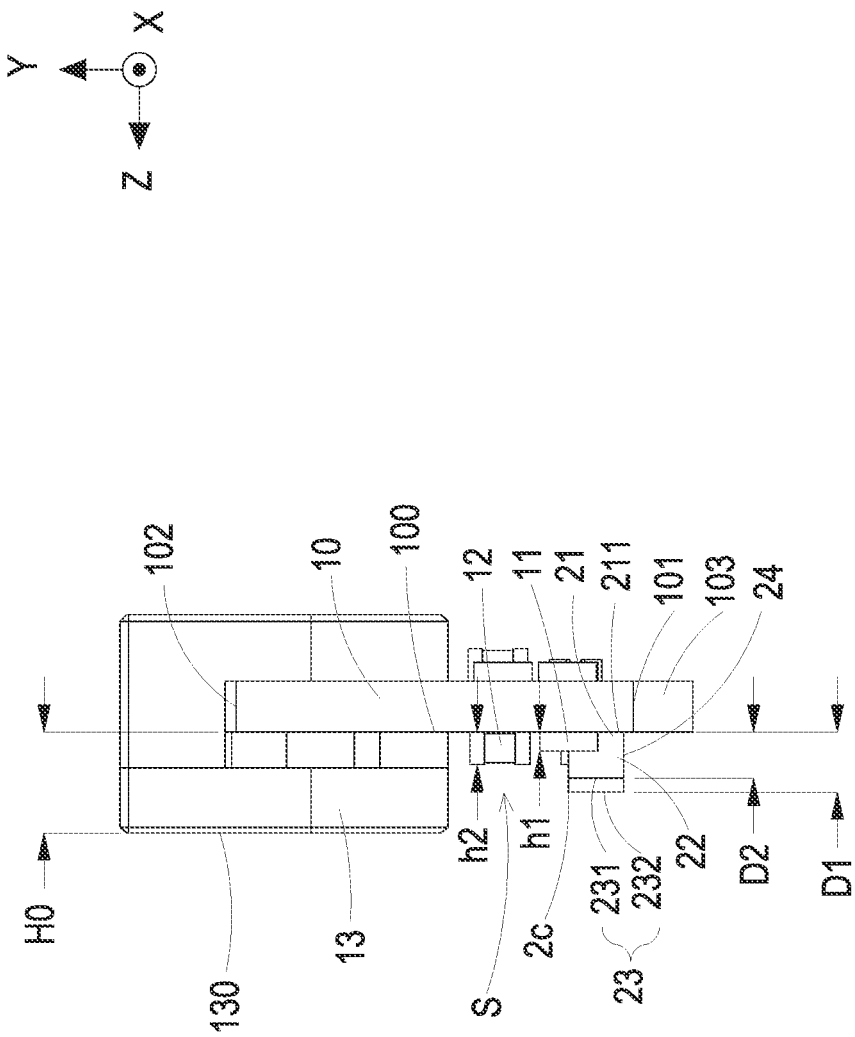
FIG. 16 is a lateral view illustrating the power module according to the fourth embodiment of the present disclosure.

FIGS. 8 to 11 show a power module according to a third embodiment of the present disclosure. FIG. 12 is a perspective view illustrating the surface-mounted heat sink of the power module according to the third embodiment of the present disclosure. In the embodiment, the power module 1b and the surface-mounted heat sink 2b are similar to the power module 1 and the surface-mounted heat sink 2a shown in FIGS. 1 to 5, and the same labels of the components represent the same components, structures and functions, not redundantly described herein. Preferably but not exclusively, in the embodiment, the surface-mounted heat sink 2b is soldered on the soldering pad 10b of the circuit board 10 through a reflow soldering process. The fin portion 23 of the surface-mounted heat sink 2b is extended in two opposite directions from a junction of the support portion 22 and the fin portion 23. Preferably but not exclusively, the two opposite directions are perpendicular to the lower side 101 of the circuit board 10. That is, the fin portion 23 is extended along the Y-axis direction. Preferably but not exclusively, the fin portion 23, the support portion 22 and the surface-mounted portion 21 collaboratively form an asymmetrical H-shaped cross section. In the embodiment, a projection area of the fin portion 23 on the surface 100 of the circuit board 10 is greater than a projection area of the support portion 22 on the surface 100 of the circuit board 10. Moreover, the projection area of the fin portion 23 on the surface 100 of the circuit board 10 is greater than a projection area of the surface-mounted portion 21 on the surface 100 of the circuit board 10. In other words, since the above fin portion 23 and the surface-mounted portion 21 are connected through the support portion 22, when the surface-mounted heat sink 2b and the surface-mounted switching device 11 or the ceramic capacitor 12 are installed on the surface 100 of the circuit board 10, a height difference is formed. In that, the width of the fin portion 23 is extendable and greater than the width of the surface-mounted surface 211. Preferably but not exclusively, the fin portion 23, the support portion 22 and the surface-mounted portion 21 collaboratively form an asymmetrical H-shaped cross section, so as to provide a larger heat dissipation area, thereby improving the heat dissipation efficiency.

In the embodiment, the fin portion 23 includes a bottom surface 231 and a sucked surface 232 parallel to each other. Preferably but not exclusively, the bottom surface 231, the sucked surface 232 and the surface-mounted surface 211 of the surface-mounted portion 21 are parallel to each other, and the bottom surface 231 is connected to the support portion 22. In some embodiments, the shape of the fin portion 23 is adjustable according to the practical requirements. Preferably but not exclusively, in other embodiments, the fin portion 23 is not parallel to the surface-mounted surface 211 of the surface-mounted portion 21, but bent or extended arbitrarily in the space S. In that, an automatic grasping device still can be utilized to realize the installation of the surface-mounted heat sink 2b. In the embodiment, a second height D2 is formed between the bottom surface 231 and the surface-mounted surface 211 of the surface-mounted portion 21. Preferably but not exclusively, the second height D2 is greater than a device height h1, which is formed by disposing the at least one surface-mounted switching device 11 on the surface 100 of the circuit board 10. In some embodiments, a projection area of the fin portion 23 on the surface 100 is partially overlapped with a projection area of the surface-mounted switching device 11 on the surface 100. That is, a part of the fin portion 23 is located above the surface-mount switching device 11. In some embodiments, the difference between the second height D2 and the device height h1 is equal to or greater than 0.5 mm. In some embodiments, the second height D2 is greater than a capacitor height h2, which is formed by disposing the ceramic capacitor 12 on the surface 100 of the circuit board 10.

On the other hand, in the embodiment, the top surface 130 disposed on one side of the magnetic element 13 and the surface 100 of the circuit board 10 form the limiting height H0, the surface-mounted heat sink 2a has the first height D1 formed between the sucked surface 232 and the surface-mounted surface 211 thereof, and the limiting height H0 is greater than or equal to the first height D1. Thus, the space above the surface-mounted switching device 11 or the ceramic capacitor 12 is effectively utilized by the surface-mounted heat sink 2b without affecting the power density of the power module 1b, and the heat dissipation efficiency is improved.

Figure 17:
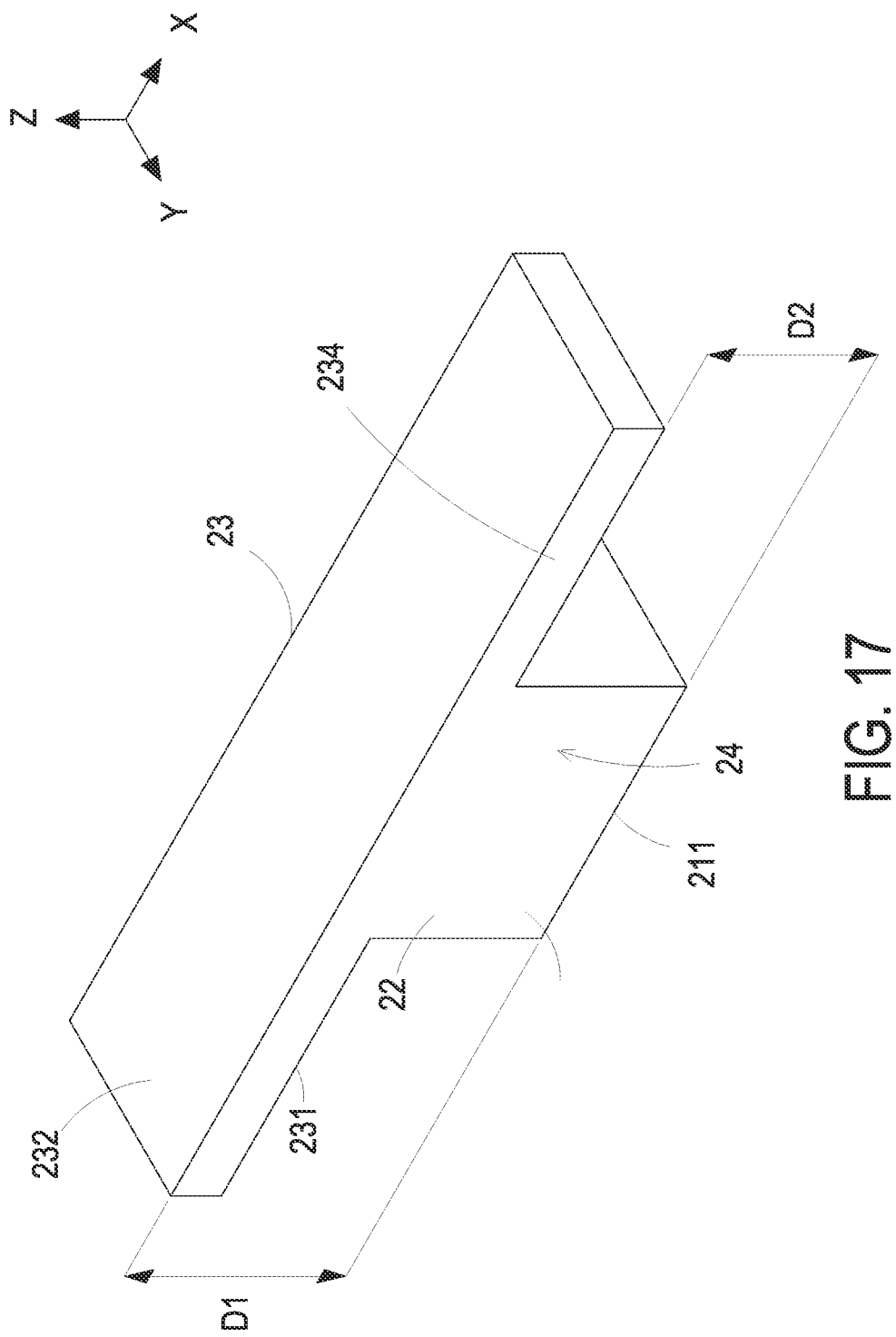
FIG. 17 is a perspective view illustrating the surface-mounted heat sink of the power module according to the fourth embodiment of the present disclosure.

FIGS. 13 to 16 show a power module according to a fourth embodiment of the present disclosure. FIG. 17 is a perspective view illustrating the surface-mounted heat sink of the power module according to the fourth embodiment of the present disclosure. In the embodiment, the power module 1c and the surface-mounted heat sink 2c are similar to the power module 1 and the surface-mounted heat sink 2a shown in FIGS. 1 to 5, and the same labels of the components represent the same components, structures and functions, not redundantly described herein. Preferably but not exclusively, in the embodiment, the surface-mounted heat sink 2c is soldered on the soldering pad 10c of the circuit board 10 through a reflow soldering process. The fin portion 23 of the surface-mounted heat sink 2c is extended in two opposite directions from a junction of the support portion 22 and the fin portion 23. Preferably but not exclusively, the two opposite directions are parallel to the lower side 101 of the circuit board 10. That is, the fin portion 23 is extended along the X-axis direction. In an embodiment, the fin portion 23 is extended in four directions from the junction of the support portion 22 and the fin portion 23. Preferably but not exclusively, the fin portion 23 is extended in the same XY plane. In another embodiment, the fin portion 23 is bent or extended arbitrarily in the space S. That is, the fin portion 23 is not parallel to the XY plane. Preferably but not exclusively, the surface-mounted heat sink 2c includes two fin portions 23 designed asymmetrically. The extending direction, the length and the bending magnitude of the pin portion 23 are adjustable in the space S, and the present disclosure is not limited thereto. In the embodiment, since the above fin portion 23 and the surface-mounted portion 21 are connected through the support portion 22, when the fin portion 23 of the surface mount heat sink 2c and the surface-mounted switching device 11 or the ceramic capacitor 12 are arranged on the circuit board 10, a height difference is formed. In that, the width of the fin portion 23 is extendable and greater than the width of the surface-mounted surface 211. Moreover, the fin portion 23, the support portion 22 and the surface-mounted portion 21 collaboratively form a T-shaped cross section, so as to provide a larger heat dissipation area, thereby improving the heat dissipation efficiency. In the embodiment, the surface-mounted heat sink 2c is disposed and corresponding to two surface-mounted switching devices 11. The two surface-mounted switching devices 11 are arranged on the surface 100 of the circuit board 10 along the lower side 101 of the circuit board 10. Preferably but not exclusively, the two surface-mounted switching devices 11 are arranged along the X-axis direction. Preferably but not exclusively, the surface-mounted surface 211 of the surface-mounted heat sink 2c is disposed on the soldering pad 10c, which is located between the two surface-mounted switching devices 11. Moreover, a projection area of the fin portion 23 on the surface 100 is partially overlapped with a projection area of the two surface-mounted switching devices 11 on the surface 100. That is, a part of the fin portion 23 is located above the two surface-mount switching devices 11. Thus, the space above the two surface-mounted switching devices 11 is effectively utilized by the surface-mounted heat sink 2c without affecting the power density of the power module 1c and the heat dissipation efficiency is improved. In the embodiment, the fin portion 23 of the surface-mounted heat sink 2c and the surface-mount switching device 11 or the ceramic capacitor 12 are misaligned in the direction from the upper side 102 to the lower side 101 of the circuit board 10, and are not located on the same horizontal plane. Preferably but not exclusively, the fin portion 23 of the surface-mounted heat sink 2c is at least partially located above the surface-mounted switching device 11 or the ceramic capacitor 12 to provide a larger heat dissipation area, thereby improving the heat dissipation efficiency.

In the embodiment, the fin portion 23 of the surface-mounted heat sink 2c has a lateral side 234. Preferably but not exclusively, the lateral side 234 of the fin portion 23, the surface-mounted portion 21 and the support portion 22 collaboratively form the lateral side 24 of the surface-mounted heat sink 2c. In the embodiment, the lateral side 234 of the fin portion 23 is coplanar with the lower side 101 of the circuit board 10. When the power module 1c is inserted into the system motherboard 3 through the plug-in portion 103 of the circuit board 10, the lateral side 234 of the fin portion 23 is attached to the surface 30 of the system motherboard 3. In other words, when the power module 1c is inserted into the system motherboard 3 through the plug-in portion 103 on the lower side 101 of the circuit board 10, the fin portion 23 of the surface-mounted heat sink 2c has the lateral side 234 to provide a positioning function during soldering the power module 1c and the system motherboard 3 together. It prevents the power module 1c from causing the ceramic capacitor 12 broken due to manual blind insertion during the process of soldering the power module 1a on the system motherboard 3. In other embodiments, the lateral side 234 of the fin portion 23 and the lateral side 24 of the surface-mounted heat sink 2c are coplanar with the lower side 101 of the circuit board 10. Certainly, the present disclosure is not limited thereto.

Figure 18:
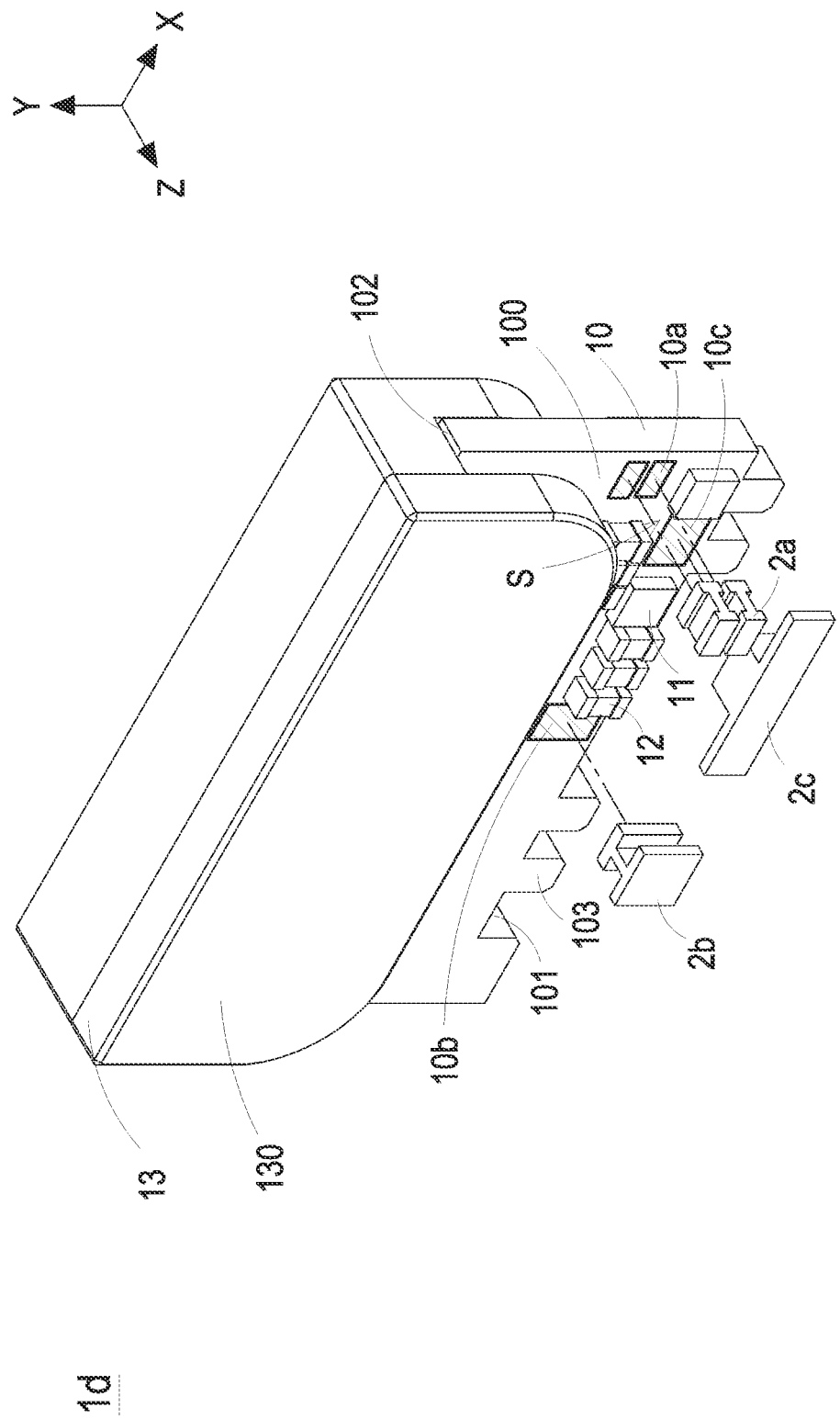
FIG. 18 is an exploded view illustrating a power module according to a fifth embodiment of the present disclosure.
Figure 19:
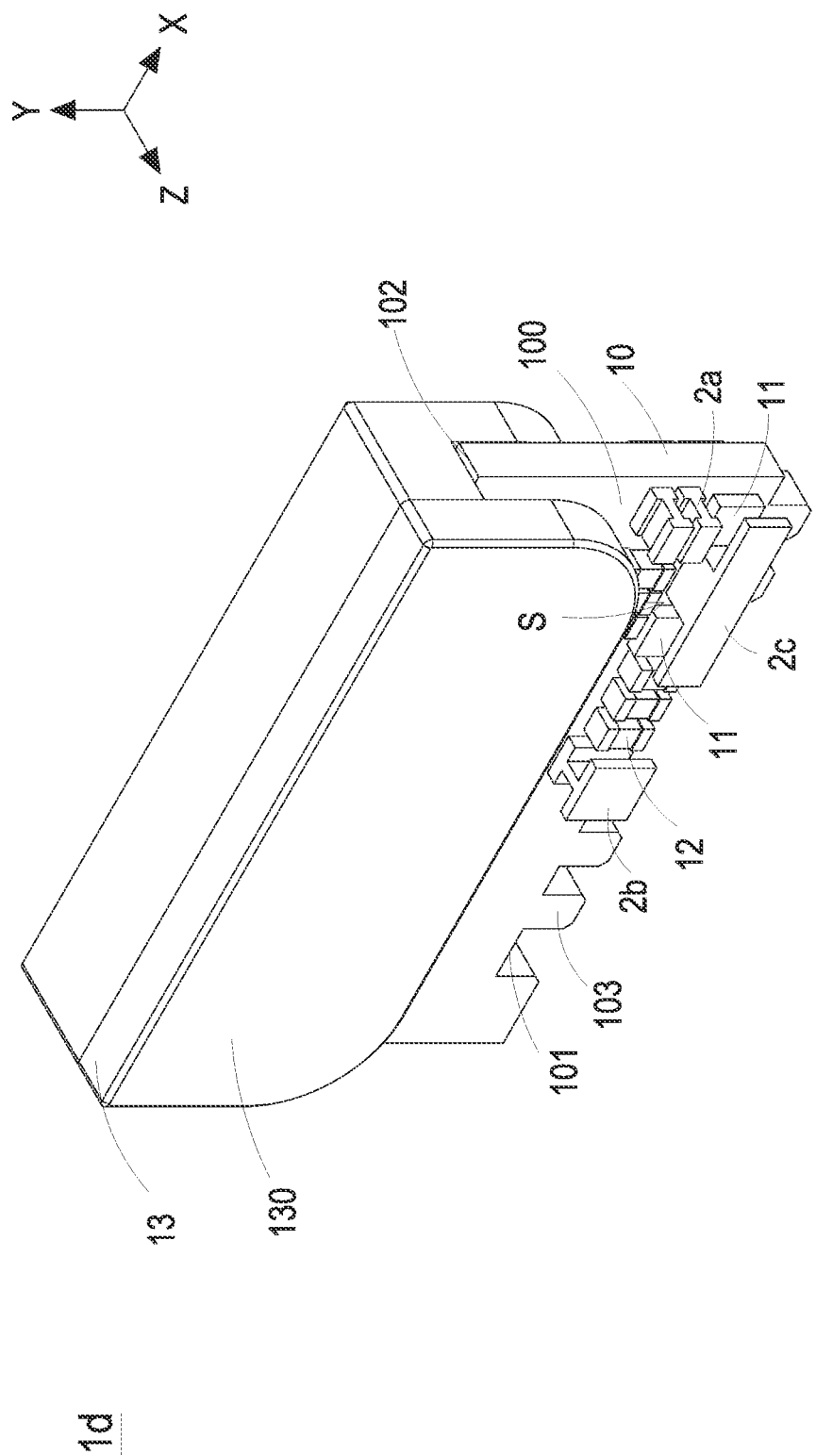
FIG. 19 is a perspective view illustrating the power module according to the fifth embodiment of the present disclosure.
Figure 20:
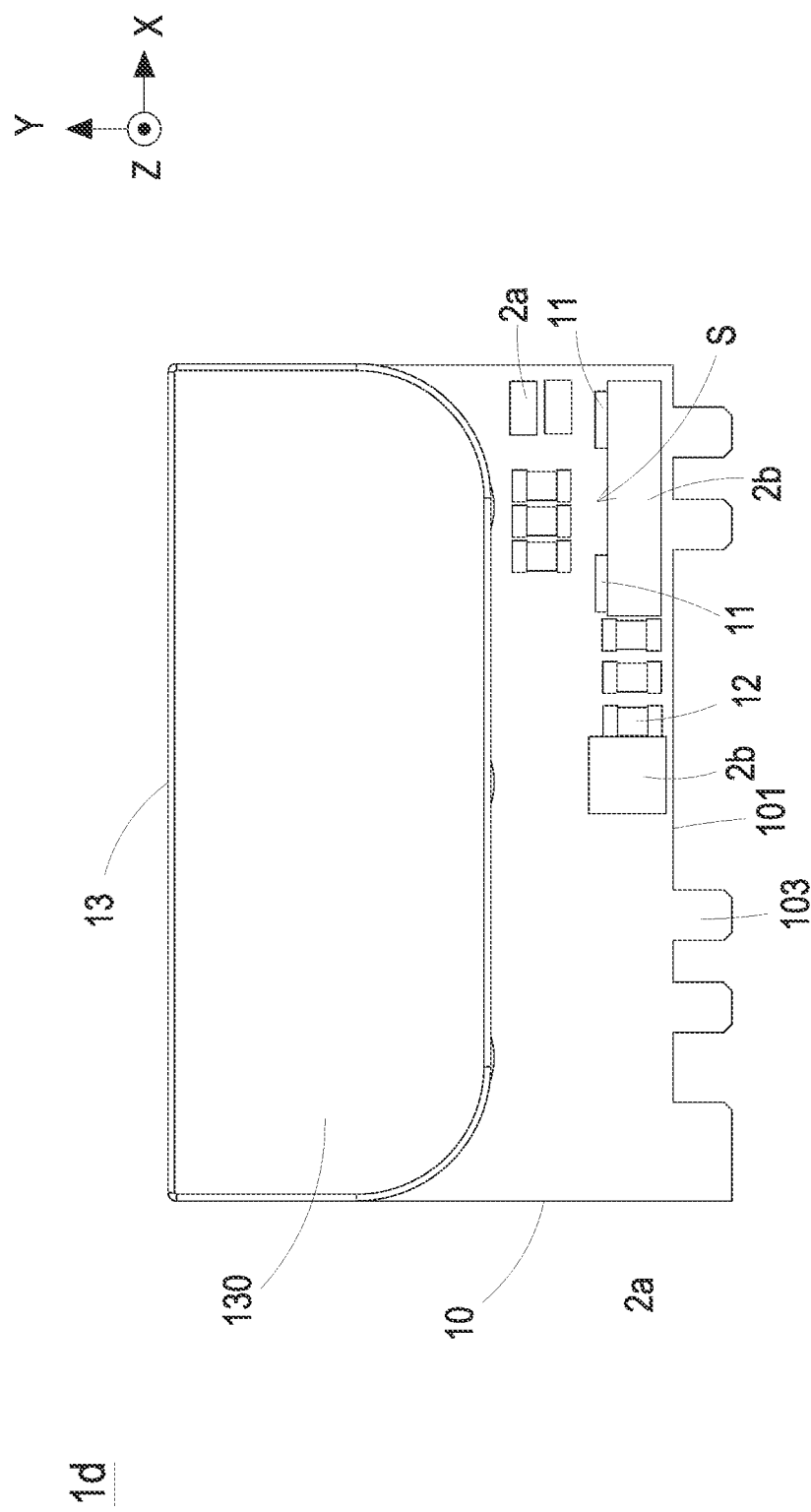
FIG. 20 is a front view illustrating the power module according to the fifth embodiment of the present disclosure.

FIGS. 18 to 20 show a power module according to a fifth embodiment of the present disclosure. In the embodiment, the power module 1d is similar to the power module 1 shown in FIGS. 1 to 4, and the same labels of the components represent the same components, structures and functions, not redundantly described herein. In the embodiment, the power module 1d includes a surface-mounted heat sink 2a, a surface-mounted heat sink 2b and a surface-mounted heat sink 2a. Preferably but not exclusively, the surface-mounted heat sink 2a, the surface-mounted heat sink 2b and the surface-mounted heat sink 2c are soldered and attached on the soldering pad 10a, the soldering pad 10b and the soldering pad 10c of the circuit board 10, respectively, through a reflow soldering process. In the embodiment, the fin portions 23 of the surface-mounted heat sink 2a, the surface-mounted heat sink 2b and the surface-mounted heat sink 2c are received within the space S collaboratively defined by the magnetic element 13 and the lower side 101 of the circuit board 10. In an embodiment, the fin portions 23 are extended along the X-axis direction or the Y-axis direction. In another embodiment, the fin portions 23 are extended in the same XY plane. In that, the positions above the surface-mounted switching device 11 or the ceramic capacitor 12 are effectively utilized to increase the size of the fin portions 23 and increase the heat dissipation area, thereby increasing the heat dissipation efficiency. Preferably but not exclusively, the sucked surfaces 232 of the fin portions 23 of the surface-mounted heat sink 2a, the surface-mounted heat sink 2b and the surface-mounted heat sink 2c are extended on the same XY plane. The extended sucked surfaces 232 are beneficial to being sucked through the suction nozzle. Then, the surface-mounted surfaces 231 are soldered to the periphery of the surface-mounted switching device 11 or the ceramic capacitor 12 on the circuit board 10 through the reflow soldering process. In an embodiment, each of the surface-mounted heat sink 2a, the surface-mounted heat sink 2b and the surface-mounted heat sink 2c has the bottom surface 231 of the fin portion 23 maintaining a height difference with the surface-mounted switching device 11 or the ceramic capacitor 12. Preferably but not exclusively, the height difference is greater than or equal to 0.5 mm. Since the surface-mounted heat sink 2a, the surface-mounted heat sink 2b and the surface-mounted heat sink 2c have small size, and are integrally formed by the aluminum alloy material, they are easy to produce in the modularize production and are suitable for heat dissipation of the switching power supply with high power density. Through the reflow soldering process, the surface-mounted heat sink 2a, the surface-mounted heat sink 2b and the surface-mounted heat sink 2c are mounted on the circuit board 10 together with the surface-mounted switching device 11 or the ceramic capacitor 12. It is easy to realize automation and further simplify the assembling process of heat dissipation devices. The cost of the power module 1d is reduced, and the product competitiveness is enhanced. Notably, the number, the size, the position and the arrangement direction of the surface-mounted heat sink 2a, the surface-mounted heat sink 2b and the surface-mounted heat sink 2c are adjustable according to the practical requirements. The present disclosure is not limited thereto and not redundantly described herein.

In summary, the present disclosure provides a surface-mounted heat sink and a power module using the same. The surface-mounted heat sink has a small size and is formed into one piece by aluminum alloy material. It is suitable for heat dissipation of a switching power module with high-power density. With the surface tin-plated, the surface-mounted heat sink is soldered on the circuit board directly or mounted together with the other surface-mounted power devices by the surface mount technology. It is easy to realize automation, and improve the production efficiency. The accuracy of placement is high. It prevents from short-circuiting or cracking due to touching peripheral devices when manually installing the heat sink. In addition, the cost of the surface-mounted heat sink made of aluminum alloy material is lower than that of the surface-mounted copper block. The fin portion above the surface-mounted portion is connected thereto through the support portion. When the surface-mounted heat sink and the power device are installed on the surface of the circuit board, the height difference between the fin portion and the surface-mounted portion is formed, and the width of the fin portion is extendable. Furthermore, the fin portion, the support portion and the surface-mounted portion form a symmetrical or asymmetrical T-shaped or H-shaped cross-section. A larger heat dissipation area is provided so as to improve the heat dissipation efficiency. Since the assembling and manufacturing process of the surface-mounted heat sink is simple, the space above the power device is utilized effectively, the size of the surface-mounted heat sink is small, and the application of the surface-mounted heat sink is flexible, it meets the heat dissipation requirements when the surface-mounted heat sink applied in a smaller space. Moreover, by combining and utilizing the surface-mounted heat sinks with different cross-section types, the heat dissipation problems in confined spaces are solved effectively. On the other hand, the top surface of the fin portion is extended, and it facilitates suction through the suction nozzle. Whereby, when the surface-mounted surface is soldered to the periphery of the power device on the circuit board through the reflow soldering process, it is easy to realize automation and further simplify the assembling process of heat dissipation devices. The cost of the power module is reduced, and the product competitiveness is enhanced. Furthermore, when the surface-mounted heat sink is disposed on the circuit board of the power module through the surface-mounted surface of the surface-mounted portion, the fin portion of the surface-mounted heat sink has a lateral side or an extension side coplanar with the lower side of the circuit board. Thus, when the power module is inserted into the system motherboard through a plug-in portion on the lower side of the circuit board, and soldered together with the system motherboard, the fin portion of the surface-mounted heat sink provides a positioning function. It avoids causing the ceramic capacitor broken due to manual blind insertion during the process of soldering the power module on the system motherboard.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A surface-mounted heat sink applied to a power module, wherein the power module comprises a circuit board having an upper side and a lower side opposite to each other, a magnetic element and at least one power device, the magnetic element is disposed at the upper side of the circuit board, the at least one power device is disposed on a surface of the circuit board and located between the magnetic element and the lower side of the circuit board,
    wherein the surface-mounted heat sink is disposed on the surface of the circuit board, and the surface-mounted heat sink is adjacent to the at least one power device,
    wherein a limiting height is defined by a top surface on one side of the magnetic element and the surface of the circuit board, a first height is defined by a sucked surface and a surface-mounted surface of the surface-mounted heat sink, and the limiting height is greater than or equal to the first height,
    wherein the surface-mounted heat sink comprises a surface-mounted portion comprising the surface-mounted surface attached to the surface of the circuit board.

2. The surface-mounted heat sink according to claim 1, comprising:
    a support portion extending from the surface-mounted portion in a direction away from the surface-mounted surface; and
    a fin portion corresponding to the surface-mounted surface of the surface-mounted portion, wherein the fin portion comprises a bottom surface and the sucked surface parallel to each other, and the bottom surface is connected to the support portion, wherein the fin portion is extended in a space collaboratively defined by the magnetic element and the lower side of the circuit board.

3. The surface-mounted heat sink according to claim 2, wherein the surface-mounted portion, the support portion and the fin portion of the surface-mounted heat sink are integrated molding by an aluminum alloy material.

4. The surface-mounted heat sink according to claim 2, wherein the surface-mounted surface of the surface-mounted heat sink is attached to the circuit board through a reflow soldering process.

5. The surface-mounted heat sink according to claim 2, wherein a projection area of the fin portion is greater than a projection area of the support portion with respect to the surface of the circuit board.

6. The surface-mounted heat sink according to claim 2, wherein a projection area of the fin portion is greater than or equal to a projection area of the surface-mounted portion with respect to the surface of the circuit board.

7. The surface-mounted heat sink according to claim 2, wherein a second height is defined by the bottom surface and the surface-mounted surface, and the second height is greater than a device height formed by disposing the at least one power device on the surface of the circuit board.

8. The surface-mounted heat sink according to claim 7, wherein the difference between the second height and the device height is greater than or equal to 0.5 mm.

9. The surface-mounted heat sink according to claim 2, wherein the fin portion is extended in two opposite directions from a junction of the support portion and the fin portion, wherein the two opposite directions are perpendicular to the lower side of the circuit board.

10. The surface-mounted heat sink according to claim 9, wherein the fin portion comprises an extension side flush with the lower side of the circuit board, and the circuit board comprises a plug-in portion, which is protruded outwardly from the lower side and configured to insert the power module into a system motherboard therethrough, wherein when the power module is inserted into the system motherboard through the plug-in portion of the circuit board, the extension side of the fin portion is attached to the system motherboard.

11. The surface-mounted heat sink according to claim 2, wherein the fin portion is extended in two opposite directions from a junction of the support portion and the fin portion, wherein the two opposite directions are parallel to the lower side of the circuit board.

12. The surface-mounted heat sink according to claim 2, wherein the fin portion and the at least one power device are misaligned with each other in a direction from the upper side to the lower side of the circuit board.

13. The surface-mounted heat sink according to claim 2, wherein the fin portion, the support portion and the surface-mounted portion form a T-shaped cross-section or an H-shaped cross-section.

14. The surface-mounted heat sink according to claim 2, wherein the at least one power device comprises at least two power devices arranged on the surface of the circuit board along the lower side, the surface-mounted surface of the surface-mounted heat sink is located between the at least two power devices, and the fin portion of the surface-mounted heat sink is located above the at least two power devices.

15. The surface-mounted heat sink according to claim 2, wherein the fin portion comprises a lateral side flush with the lower side of the circuit board, and the circuit board comprises a plug-in portion, which is protruded outwardly from the lower side and configured to insert the power module into a system motherboard therethrough, wherein when the power module is inserted into the system motherboard through the plug-in portion of the circuit board, the lateral side of the fin portion is attached to the system motherboard.

16. The surface-mounted heat sink according to claim 2, wherein the power module further comprises a ceramic capacitor, the ceramic capacitor is disposed on the surface of the circuit board, wherein a second height is defined by the bottom surface and the surface-mounted surface, and the second height is greater than a capacitor height defined by disposing the ceramic capacitor on the surface of the circuit board.

17. A power module comprising:
a circuit board comprising a surface, an upper side and a lower side opposite to each other, and the surface is connected between the upper side and the lower side;
a magnetic element disposed adjacent to the upper side of the circuit board, and covering at least one portion of the surface of the circuit board;
at least one power device disposed on the surface of the circuit board, and located between the magnetic element and the lower side of the circuit board; and
at least one surface-mounted heat sink disposed on the surface of the circuit board and adjacent to the at least one power device, wherein a limiting height is defined by a top surface disposed on one side of the magnetic element and the surface of the circuit board, a first height is defined by a sucked surface and a surface-mounted surface of the surface-mounted heat sink, and the limiting height is greater than or equal to the first height,
wherein the surface-mounted heat sink comprises a surface-mounted portion comprising the surface-mounted surface attached to the surface of the circuit board.

18. The power module according to claim 17, wherein the surface-mounted heat sink comprises:
a support portion extending from the surface-mounted portion in a direction away from the surface-mounted surface; and
a fin portion spatially corresponding to the surface-mounted surface of the surface-mounted portion, wherein the fin portion comprises a bottom surface and the sucked surface parallel to each other, and the bottom surface is connected to the support portion, wherein the fin portion is extended in a space collaboratively defined by the magnetic element and the lower side of the circuit board.

19. The power module according to claim 18, wherein a second height is formed between the bottom surface and the surface-mounted surface, and the second height is greater than a device height formed by disposing the at least one power device on the surface of the circuit board.

20. The power module according to claim 18, wherein the power module further comprises a ceramic capacitor disposed on the surface of the circuit board, wherein a second height is formed between the bottom surface and the surface-mounted surface, and the second height is greater than a capacitor height formed by disposing the ceramic capacitor on the surface of the circuit board.

* * * * *